(12) United States Patent
Lee et al.

(10) Patent No.: US 10,950,578 B2
(45) Date of Patent: Mar. 16, 2021

(54) SEMICONDUCTOR DEVICE, SEMICONDUCTOR PACKAGE AND METHOD OF MANUFACTURING THE SAME

(71) Applicant: SAMSUNG ELECTRONICS CO., LTD., Suwon-si (KR)

(72) Inventors: Hak-Seung Lee, Seoul (KR);
Kwang-Jin Moon, Hwaseong-si (KR);
Tae-Seong Kim, Suwon-si (KR);
Dae-Suk Lee, Suwon-si (KR);
Dong-Chan Lim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/430,625

(22) Filed: Jun. 4, 2019

(65) Prior Publication Data

US 2020/0161277 A1   May 21, 2020

(30) Foreign Application Priority Data

Nov. 21, 2018   (KR) .................. 10-2018-0144338

(51) Int. Cl.
*H01L 25/065* (2006.01)
*H01L 23/48* (2006.01)
(Continued)

(52) U.S. Cl.
CPC ...... *H01L 25/0657* (2013.01); *H01L 23/3128* (2013.01); *H01L 23/481* (2013.01);
(Continued)

(58) Field of Classification Search
CPC . H01L 25/0657; H01L 25/50; H01L 23/3128; H01L 23/481; H01L 23/5226; H01L 23/5283; H01L 24/09; H01L 24/17
(Continued)

(56) References Cited

U.S. PATENT DOCUMENTS 7,598,523 B2   10/2009  Luo et al.
7,683,459 B2    3/2010  Ma et al.
(Continued)

FOREIGN PATENT DOCUMENTS

| EP | 1 804 287 A2 | 7/2007 |
| JP | 2010-80897 A | 4/2010 |
| KR | 10-0888335 B1 | 3/2009 |

OTHER PUBLICATIONS

Communication dated Dec. 5, 2019 by the European patent Office in counterpart European Patent Application No. 19178376.0.
(Continued)

*Primary Examiner* — Tong-Ho Kim
(74) *Attorney, Agent, or Firm* — Sughrue Mion, PLLC

(57) ABSTRACT

A semiconductor package includes a first semiconductor chip and a second semiconductor chip stacked on the first semiconductor chip. The first semiconductor chip includes a substrate having a first via hole, an insulation interlayer formed on the substrate and having a first bonding pad in an outer surface thereof and a second via hole connected to the first via hole and exposing the first bonding pad, and a plug structure formed within the first and second via holes to be connected to the first bonding pad. The second semiconductor chip includes a second bonding pad bonded to the plug structure which is exposed from a surface of the substrate of the first semiconductor chip.

20 Claims, 34 Drawing Sheets

(51) Int. Cl.
  *H01L 23/522*    (2006.01)
  *H01L 23/528*    (2006.01)
  *H01L 23/31*     (2006.01)
  *H01L 23/00*     (2006.01)
  *H01L 25/00*     (2006.01)

(52) U.S. Cl.
  CPC ...... *H01L 23/5226* (2013.01); *H01L 23/5283* (2013.01); *H01L 24/09* (2013.01); *H01L 24/17* (2013.01); *H01L 25/50* (2013.01)

(58) Field of Classification Search
  USPC ........................................................ 257/670
  See application file for complete search history.

(56) References Cited

U.S. PATENT DOCUMENTS

| | | | |
|---|---|---|---|
| 7,851,346 B2 | 12/2010 | Lee et al. | |
| 8,053,900 B2 | 11/2011 | Yu et al. | |
| 8,546,188 B2 | 10/2013 | Liu et al. | |
| 9,064,941 B2 | 6/2015 | Jung et al. | |
| 9,530,706 B2 | 12/2016 | Kang et al. | |
| 9,991,244 B2 | 6/2018 | Lin | |
| 2009/0200679 A1* | 8/2009 | Harada | H01L 21/76898 257/773 |
| 2010/0244251 A1 | 9/2010 | Torazawa et al. | |
| 2012/0306095 A1 | 12/2012 | Han | |
| 2013/0285253 A1* | 10/2013 | Aoki | H01L 24/08 257/774 |
| 2017/0110388 A1* | 4/2017 | Park | H01L 23/53228 |
| 2017/0345798 A1 | 11/2017 | Yu et al. | |
| 2018/0068984 A1 | 3/2018 | Beyne et al. | |

OTHER PUBLICATIONS

Hu, Y. H. et al., "Cu—Cu Hybrid Bonding as Option for 3D IC Stacking", 2012 IEEE International Interconnect Technology Conference (IITC 2012), San Jose, California, USA, Jun. 4, 2012-Jun. 6, 2012, pp. 1-3, XP032211558. (3 pages total).

* cited by examiner

SEMICONDUCTOR DEVICE, SEMICONDUCTOR PACKAGE AND METHOD OF MANUFACTURING THE SAME

PRIORITY STATEMENT

This application claims priority from Korean Patent Application No. 10-2018-0144338, filed on Nov. 21, 2018 in the Korean Intellectual Property Office, the disclosure of which in incorporated herein by reference in its entirety.

BACKGROUND

1. Field

Example embodiments relate to a semiconductor package and a method of manufacturing the semiconductor package, more particularly, to a semiconductor package including semiconductor devices bonded to each other by wafer-to-wafer bonding and a method of manufacturing the semiconductor package.

2. Description of the Related Art

A multi-chip package may be manufactured by a via last scheme. However, when a through silicon via (TSV) is formed after forming an insulation interlayer, the TSV may be landed on a metal wiring (M1 metal) of the insulation interlayer, thereby causing copper (Cu) punch-through due to total thickness variation (TTV) in a chemical mechanical planarization (CMP) process.

SUMMARY

Example embodiments provide a semiconductor device capable of providing a process margin for a through silicon via (TSV).

Example embodiments provide a semiconductor package including the semiconductor device.

Example embodiments provide a method of manufacturing the semiconductor device.

According to example embodiments, there is provided a semiconductor package which may include a first semiconductor chip and a second semiconductor chip stacked on the first semiconductor chip. The first semiconductor chip may include a substrate having a first via hole, an insulation interlayer formed on the substrate and having a first bonding pad in an outer surface thereof and a second via hole connected to the first via hole and exposing the first bonding pad, and a plug structure formed within the first and second via holes to be connected to the first bonding. The second semiconductor chip may include a second bonding pad bonded to the plug structure which is exposed from a surface of the substrate of the first semiconductor chip.

According to example embodiments, there is provided a semiconductor package which may include a first semiconductor chip and a second semiconductor chip stacked on the first semiconductor chip. The first semiconductor chip may include a substrate having a first surface and a second surface opposite to each other, an insulation interlayer formed on the first surface of the substrate to insulate a metal wiring provided therein, and having an outermost insulation layer in which a first bonding pad provided, and a plug structure penetrating through the substrate and the insulation interlayer to extend to the first bonding pad; and a second semiconductor chip stacked on the first semiconductor chip and including a second bonding pad bonded to the plug structure which is exposed from the second surface of the substrate of the first semiconductor chip.

According to example embodiments, there is provided a semiconductor device which may include a substrate having a first surface and a second surface opposite to each other, an insulation interlayer formed on the first surface of the substrate to insulate a circuit pattern provided therein, and having an outermost insulation layer in which a bonding pad provided, and a plug structure penetrating through the substrate and the insulation interlayer to extend to the bonding pad.

According to example embodiments, there is provided a method of manufacturing a semiconductor device, in which an insulation interlayer may be formed on a first surface of a substrate, the insulation interlayer having an outermost insulation layer in which a first bonding pad is provided. A via hole may be formed to extend from the first surface to a second surface of the substrate opposite to first surface and penetrate through the substrate and the insulation interlayer to expose the first bonding pad. A plug structure may be formed within the via hole to be in contact with the first bonding pad.

According to example embodiments, a semiconductor package may include at least two first and second semiconductor chips. An exposed TSV in an upper surface of the first semiconductor chip may be bonded to a bonding pad in a lower surface of the second semiconductor chip by Cu—Cu hybrid bonding. The TSV penetrating through a substrate of the first semiconductor chip may make contact with a bonding pad in a lower surface of the first semiconductor chip.

Accordingly, the stacked first and second semiconductor chips may have Cu—Cu hybrid bonding structure. In processes of forming the first semiconductor chip, when the TSV is formed after forming the insulation interlayer (by via last scheme), the TSV may be formed such that the TSV is landed directly on the bonding pad of the insulation interlayer, not a metal wiring (M1 metal) of the insulation interlayer to thereby prevent Cu punch-through due to total thickness variation (TTV) in a chemical mechanical planarization (CMP) process.

BRIEF DESCRIPTION OF THE DRAWINGS

Example embodiments will be more clearly understood from the following detailed description taken in conjunction with the accompanying drawings.

FIG. 1 is a cross-sectional view illustrating a semiconductor package in accordance with example embodiments.

FIG. 2 is an enlarged cross-sectional view illustrating "A" portion in FIG. 1.

FIGS. 3 to 14 are cross-sectional views illustrating a method of manufacturing a semiconductor package in accordance with example embodiments.

FIG. 15 is a cross-sectional view illustrating a semiconductor package in accordance with example embodiments.

FIG. 16 is an enlarged cross-sectional view illustrating "B" portion in FIG. 15.

FIG. 17 is a cross-sectional view illustrating a semiconductor package in accordance with example embodiments.

FIG. 18 is an enlarged cross-sectional view illustrating "C" portion in FIG. 17.

FIGS. 19 to 34 are cross-sectional views illustrating a method of manufacturing a semiconductor package in accordance with example embodiments.

DETAILED DESCRIPTION OF EXAMPLE EMBODIMENTS

Hereinafter, example embodiments will be explained in detail with reference to the accompanying drawings.

It will be understood that when an element or layer is referred to as being "over," "above," "on," "connected to" or "coupled to" another element or layer, it can be directly over, above, on, connected or coupled to the other element or layer or intervening elements or layers may be present. In contrast, when an element is referred to as being "directly over," "directly above," "directly on," "directly connected to" or "directly coupled to" another element or layer, there are no intervening elements or layers present. Like numerals refer to like elements throughout. As used herein, the term "and/or" includes any and all combinations of one or more of the associated listed items. Spatially relative terms, such as "beneath," "below," "lower," "over," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Figure 1:
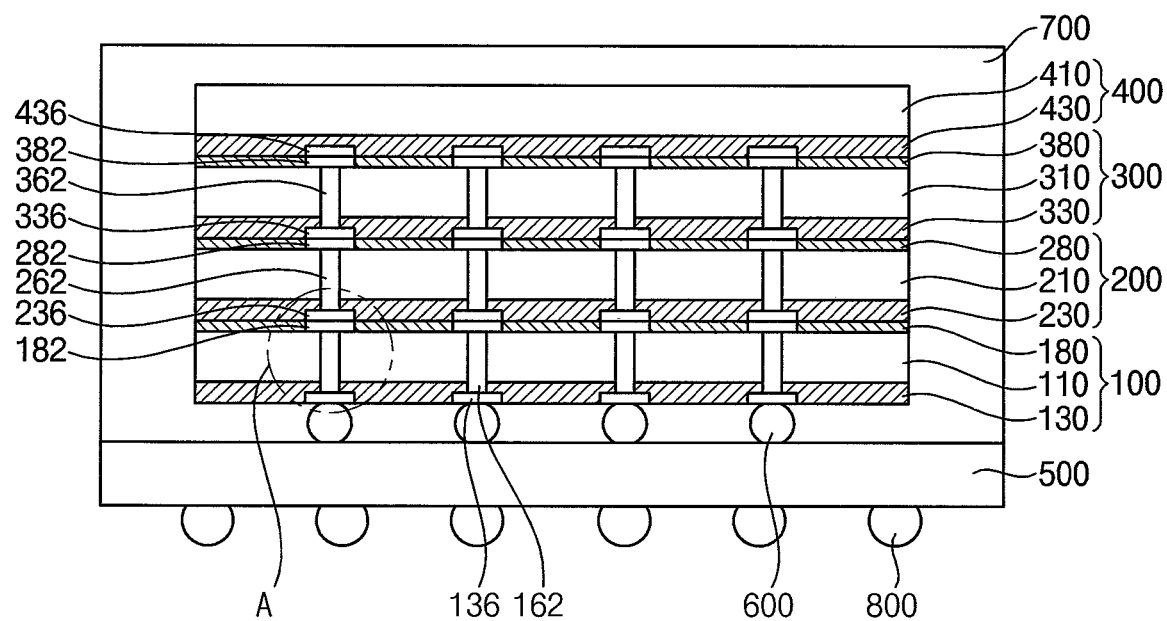
FIGS. 1 to 34 represent non-limiting, example embodiments as described herein.
Figure 2:
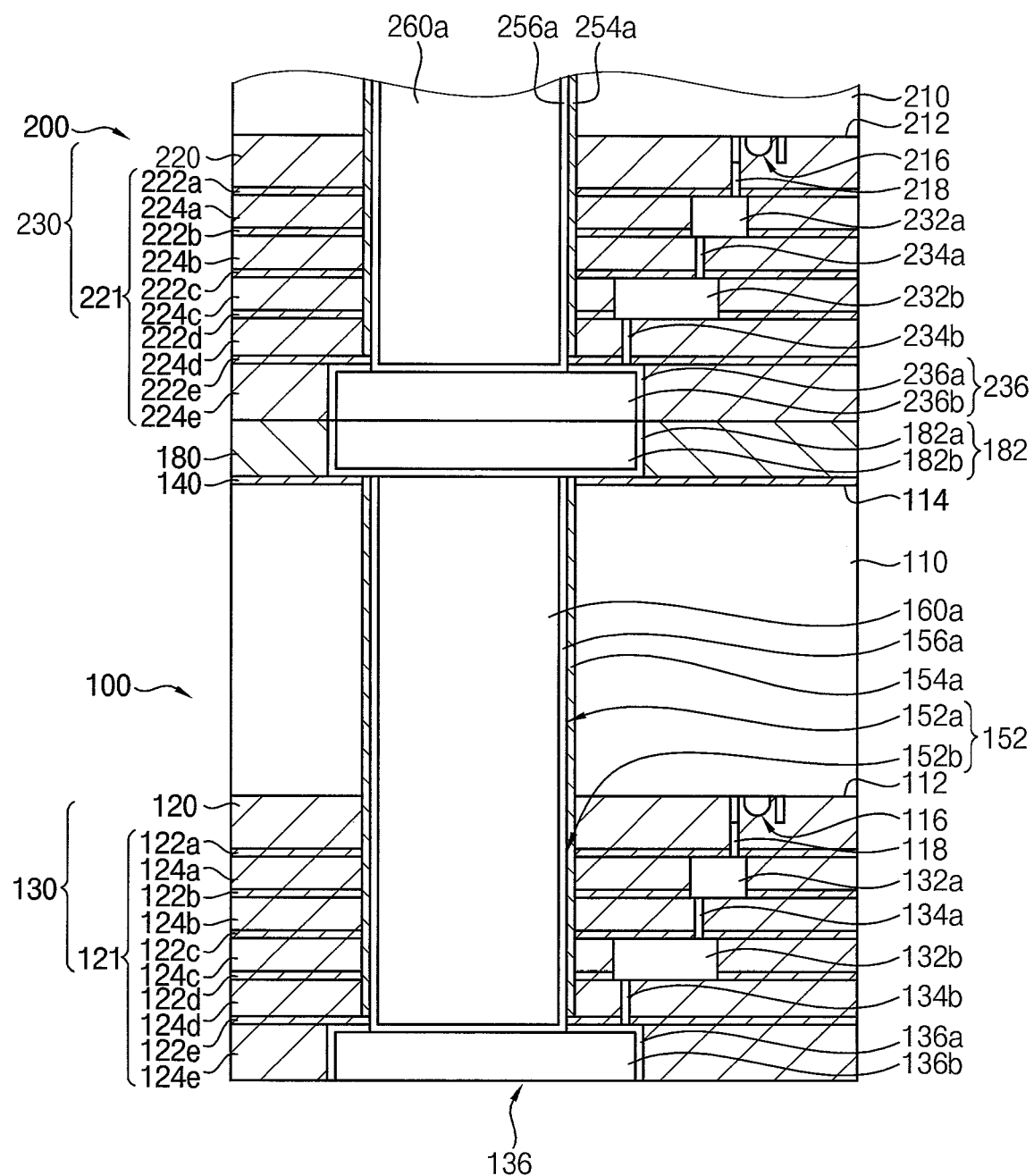

FIG. 1 is a cross-sectional view illustrating a semiconductor package in accordance with example embodiments. FIG. 2 is an enlarged cross-sectional view illustrating "A" portion in FIG. 1.

Referring to FIGS. 1 and 2, a semiconductor package 10 may include stacked semiconductor chips. The semiconductor package 10 may include a package substrate 500, first to fourth semiconductor chips 100, 200, 300, 400 and a molding member 700. Additionally, the semiconductor package 10 may further include conductive bumps 600 and outer connection members 800.

The package substrate 500 may be a printed circuit board (PCB) including circuit patterns therein. Substrate pads may be provided on an upper surface of the package substrate 500, and the outer connection members 800 such as solder balls may be provided on a lower surface of the package substrate 500.

A plurality of the semiconductor chips may be stacked on the upper surface of the package substrate 500. In this embodiment, the first semiconductor chip 100 may include a structure the same as or similar to that of the first semiconductor chip 100 in FIG. 2. The structure of the second to fourth semiconductor chips 200, 300, 400 may be substantially the same as or similar to that of the first semiconductor chip 100 in FIG. 2. Thus, same or like reference numerals will be used to refer to the same or like elements and any further repetitive explanation concerning the above elements will be omitted.

The first to fourth semiconductor chips 100, 200, 300, 400 may be stacked on the package substrate 500. In this embodiment, the semiconductor package as multi-chip package including four stacked semiconductor chips 100, 200, 300, 400 are exemplarily illustrated, and thus, it may not be limited thereto.

The conductive bumps 600 may be interposed between the package substrate 500 and the first semiconductor chip 100. The conductive bump 600 may be electrically connect a substrate pad of the package substrate 500 and a first bonding pad 136 of the first semiconductor chip 100 to each other.

The first semiconductor chip 100 may include a substrate 110, an insulation interlayer 130, the first bonding pad 136, a second bond pad 182, and a through via such as a through silicon via (TSV) 162.

The substrate 110 may have a first surface 112 and a second surface 114 opposite to each other. The first surface 112 may be an active surface, and the second surface 114 may be a non-active surface. At least one circuit pattern 116 may be provided on the first surface 112 of the substrate 110. For example, the substrate 110 may be a single crystalline silicon substrate. The circuit pattern 116 may include a transistor, a diode, etc. The circuit pattern 116 may constitute circuit elements. Accordingly, the first semiconductor chip 100 may be a semiconductor device including a plurality of circuit elements formed therein.

The insulation interlayer 130 may be provided on the first surface 112 of the substrate 110. The insulation interlayer 130 may include a plurality of insulation layers and lower wirings in the insulation layers. The first bonding pad 136 may be provided in an outermost insulation layer of the insulation interlayer 130.

For example, the insulation interlayer 130 may include a first insulation interlayer 120 and a second insulation interlayer 121.

The first insulation interlayer 120 may cover the circuit pattern 116 on the first surface 112 of the substrate 110. The first insulation interlayer 120 may include silicon oxide or a low dielectric material, for example. The first insulation interlayer 120 may include lower wirings 118 therein.

The second insulation interlayer 121 may include first to fifth buffer layers 122a, 122b, 122c, 122d, 122e and first to fifth insulation layers 124a, 124b, 124c, 124d, 124e stacked alternately on one another. For example, the first to fifth buffer layers 122a, 122b, 122c, 122d, 122e may include silicon nitride, silicon carbon nitride (SiCN), silicon carbon oxynitride (SiCON), etc. The first to firth insulation layers 124a, 124b, 124c, 124d, 124e may include silicon oxide or carbon doped silicon oxide.

The second insulation interlayer 121 may include a plurality of metal wirings. For example, the second insulation interlayer 121 may include first and second metal wirings 132a, 132b. The first bonding pad 136 including a pad barrier pattern 136a and a pad conductive pattern 136b may be provided in the outermost insulation layer of the insulation interlayer 130. The first bonding pad 136 may be exposed through a lower surface of the insulation interlayer 130.

Accordingly, the circuit pattern 116 may be electrically connected to the first bonding pad 136 through the lower wirings 118 and the first and second metal wirings 132a, 132b.

The second insulation interlayer 121 is illustrated in FIG. 2 as including two metal wiring layers, but it may not be limited thereto. The second insulation interlayer 121 as a back end of line (BEOL) metal wiring layer may include three or more metal wiring layers.

The TSV 162 having a plug structure may be provided in a via hole 152 of the first semiconductor chip 100. The plug structure 162 may extend from the second surface 114 of the substrate 110 in a vertical direction to penetrate through the substrate 110 and the insulation interlayer 130 such that the plug structure 162 makes contact with the first bonding pad 136.

The via hole 152 may include a first via hole 152a and a second via hole 152b connected to each other in the vertical direction. The substrate 110 may have the first via hole 152a which extends from the second surface 114 to the first surface 112 of the substrate 110 in the vertical direction. The insulation interlayer 130 may have the second via hole 152b which extends from the first surface 112 of the substrate 110 in the vertical direction to expose the pad conductive pattern 136b of the first bonding pad 136.

The plug structure 162 may include a barrier pattern 156a and a conductive pattern 160a. The barrier pattern 156a may be provided in an inner surface of the via hole 152. The conductive pattern 160a may be provided on the barrier pattern 156a to fill the via hole 152. The barrier pattern 156a may make contact with the pad conductive pattern 136b exposed through the second via hole 152b. The barrier pattern 156a may include a metal nitride, e.g., titanium nitride, tantalum nitride, etc. and/or a metal, e.g., titanium, tantalum, etc. The conductive pattern 160a may include copper (Cu), not being limited thereto.

Accordingly, a lower surface of the plug structure 162 may be in contact with the pad conductive pattern 136b of the first bonding pad 136. An upper surface of the plug structure 162 may be exposed from the second surface 114 of the substrate 110. The upper surface of the plug structure 162 may be coplanar with the second surface 114 of the substrate 110.

In example embodiments, the first semiconductor chip 100 may further include a polishing stop layer 140 on the second surface 114 of the substrate 110. In this case, the upper surface of the plug structure 162 may be coplanar with an upper surface of the polishing stop layer 140.

An insulation layer 180 having the second bonding pad 182 therein may be provided on the second surface 114 of the substrate 110. The second bonding pad 182 may be arranged on the exposed upper surface of the plug structure 162. The second bonding pad 182 may include a pad barrier pattern 182a and a pad conductive pattern 182b. The insulation layer 180 may be provided on the polishing stop layer 140. Similarly, the second semiconductor chip 200 may include a substrate 210, an insulation interlayer 230, a first bonding pad 236, a second bonding pad 282 and a plug structure 262.

The second semiconductor chip 200 may be arranged on the first semiconductor chip 100 such that the first bonding pad 236 of the second semiconductor chip 200 faces the second bonding pad 182 of the first semiconductor chip 100.

The second bonding pad 182 of the first semiconductor chip 100 and the first bonding pad 236 of the second semiconductor chip 200 may be bonded to each other by Cu—Cu hybrid bonding.

Similarly, the second bonding pad 282 of the second semiconductor chip 200 and a first bonding pad 336 of the third semiconductor chip 300 may be bonded to each other by Cu—Cu hybrid bonding. A second bonding pad 382 of the third semiconductor chip 300 and a first bonding pad 436 of the fourth semiconductor chip 400 may be bonded to each other by Cu—Cu hybrid bonding.

Accordingly, the stack semiconductor package may have Cu—Cu hybrid bonding structure.

The molding member 700 may be provided on the package substrate 500 to cover the first to fourth semiconductor chips 100, 200, 300, 400. The molding member 700 may include an epoxy molding compound (EMC) material.

As mentioned above, the multi-chip package may include at least two first and second semiconductor chips 100, 200. The pad conductive pattern 182b of the second bonding pad 182 of the first semiconductor chip 100 may be bonded to the pad conductive pattern 236b of the first bonding pad 236 of the second semiconductor chip 200 by Cu—Cu hybrid bonding. The plug structure 162 penetrating through the substrate 110 of the first semiconductor chip 100 may make contact with the first bonding pad 136 which is provided in the outermost insulation layer to be exposed through a lower surface of the first semiconductor chip 100.

Accordingly, the stacked first and second semiconductor chips 100, 200 may have Cu—Cu hybrid bonding structure. In case that the first semiconductor chip 100 has a via last scheme, the plug structure 162 may be landed on the first bonding pad 136, not the metal wiring (M1 metal) of the insulation interlayer 130, to thereby prevent Cu punch-through due to total thickness variation (TTV) in a chemical mechanical planarization (CMP) process.

Hereinafter, a method of manufacturing the semiconductor package in FIGS. 1 and 2 will be explained.

FIGS. 3 to 14 are cross-sectional views illustrating a method of manufacturing a semiconductor package in accordance with example embodiments.

Figure 3:
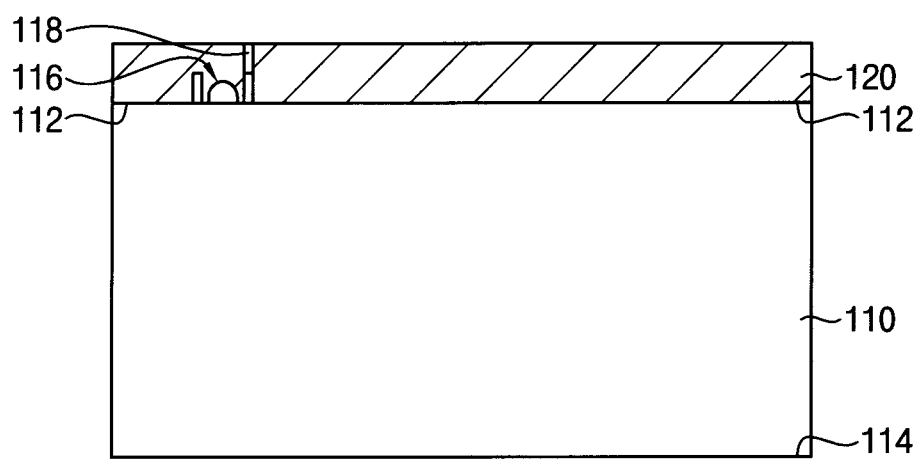
Figure 4:
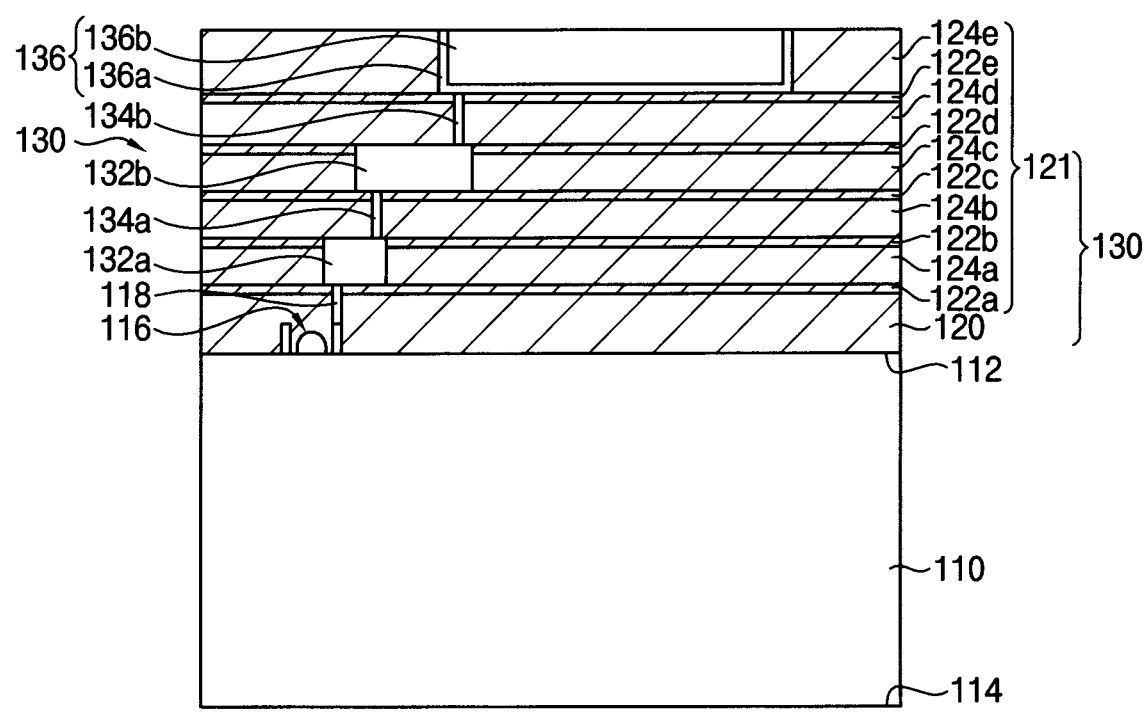

Referring to FIGS. 3 and 4, an insulation interlayer 130 having a first bonding pad 136 may be formed on a first surface 112 of a substrate 110 of a first wafer.

First, as illustrated in FIG. 3, after a circuit pattern 116 is formed on the first surface 112 of the substrate 110, a first insulation interlayer 120 may be formed to cover the circuit pattern 116 on the first surface 112 of the substrate 110. Lower wirings 118 having contacts may be formed in the first insulation interlayer 120. Portions of the lower wirings 118 may be exposed through a surface of the first insulation interlayer 120. The first surface 112 of the substrate 110 may be an active surface, and a second surface 114 of the substrate 110 opposite to the first surface 112 may be a non-active surface.

For example, the substrate 110 may include silicon, germanium, silicon-germanium, or III-V compounds, e.g., GaP, GaAs, GaSb, etc. In some embodiments, the substrate 110 may be a silicon-on-insulator (SOI) substrate, or a germanium-on-insulator (GOI) substrate. The first insulation interlayer 120 may be formed to include, for example, silicon oxide or a low dielectric material.

As illustrated in FIG. 4, a second insulation interlayer 121 may be formed on the first insulation interlayer 120.

A first buffer layer 122a and a first insulation layer 124a may be formed on the first insulation interlayer 120, and then, the first insulation layer 124a may be partially etched to form a first trench which exposes the lower wiring 118, and a first metal wiring 132a may be formed in the first trench. The first buffer layer 122a may be used as an etch stop layer.

A second buffer layer 122b and a second insulation layer 124b may be formed on the first insulation layer 124a, and then, the second insulation layer 124b may be partially etched to form a first contact hole which exposes a portion of the first metal wiring 132a, and a first contact 134a may be formed in the first contact hole. The second buffer layer 122b may be used as an etch stop layer.

A third buffer layer 122c and a third insulation layer 124c may be formed on the second insulation layer 124b, and then, the third insulation layer 124c may be partially etched to form a second trench which exposes the first contact 134a, and a second metal wiring 132b may be formed in the second trench.

A fourth buffer layer 122d and a fourth insulation layer 124d may be formed on the third insulation layer 124c, and then, the fourth insulation layer 124d may be partially etched to form a second contact hole which exposes a portion of the second metal wiring 132b, and a second contact 134b may be formed in the second contact hole.

A fifth buffer layer 122e and a fifth insulation layer 124e may be formed on the fourth insulation layer 124d, and then, the fifth insulation layer 124e may be partially etched to form a third trench which exposes the second contact 134b, and the first bonding pad 136 may be formed in the third trench. A pad barrier pattern 136a and a pad conductive pattern 136b may be formed in the third trench. The pad conductive pattern 136b may be formed on the pad barrier pattern 136a to fill the third trench.

The pad barrier pattern 136a may include a metal nitride, e.g., titanium nitride, etc. and/or a metal, e.g., titanium, tantalum, etc. The pad conductive pattern may include a metal, e.g., copper, aluminum, gold, indium, nickel, etc. In this embodiment, the pad conductive pattern 136a may include copper. That is, the first bonding pad 136 including the pad barrier pattern 136a and the pad conductive pattern 136b may be provided in an outermost insulation layer of the insulation interlayer 130. The first bonding pad 136 may be exposed through the outer surface of the insulation interlayer 130. Here, the outermost insulation layer of the insulation interlayer 130 may be a redistribution wiring layer.

For example, the first to fifth buffer layers 122a, 122b, 122c, 122d, 122e may be formed of silicon nitride, silicon carbon nitride (SiCN), silicon carbon oxynitride (SiCON), etc. The first to firth insulation layers 124a, 124b, 124c, 124d, 124e may be formed of silicon oxide or carbon doped silicon oxide.

The second insulation interlayer 121 may include two metal wiring layers, however, it may not be limited thereto. The second insulation interlayer 121 as a back end of line (BEOL) metal wiring layer may include three or more metal wiring layers.

A thickness of the first bonding pad 136 in the outermost insulation layer may be greater than a thickness of the first metal wiring 132a of the metal wiring layer.

Figure 5:
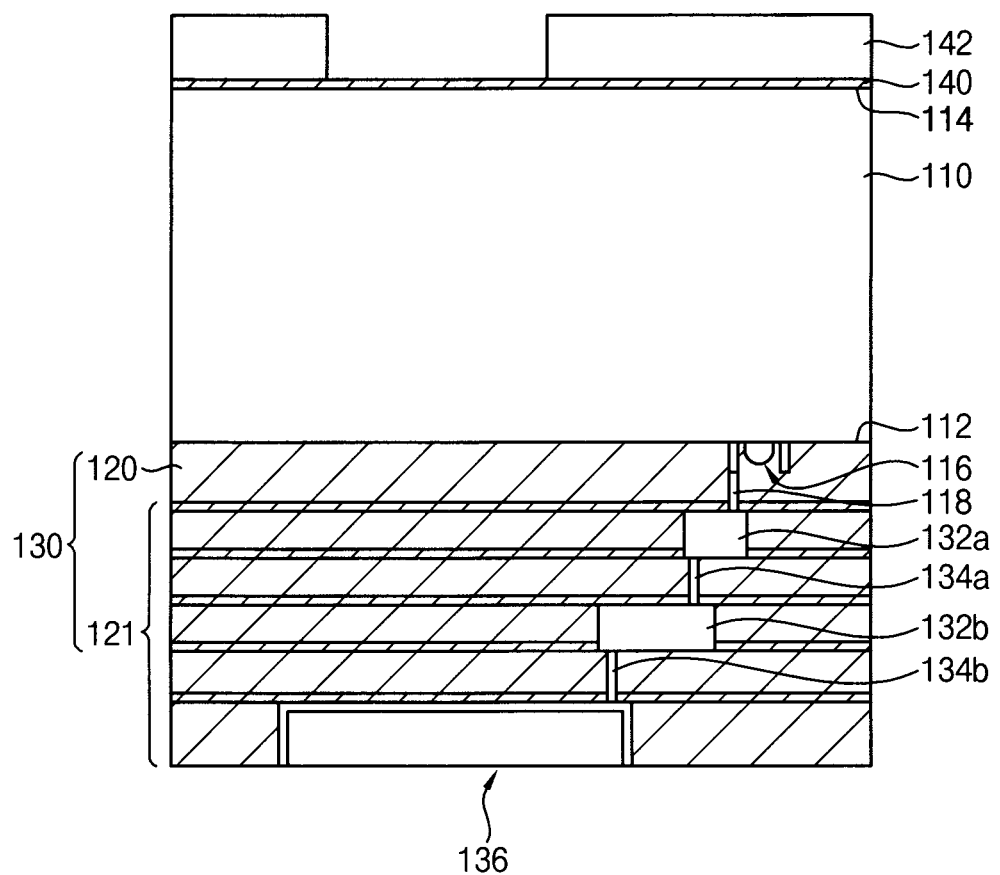

Referring to FIG. 5, the second surface 114 of the substrate 110 may be planarized, and then, a first photoresist pattern 142 for an etch process may be formed on the planarized second surface 114.

The second surface 114 of the substrate 110 may be planarized to control a thickness of the substrate 110. For example, the second surface 114 of the substrate 110 may be partially removed by a grinding process. The thickness of the substrate 110 may be determined considering a thickness of a TSV, that is, a via electrode, to be formed, a thickness of a stack package, etc.

In example embodiments, a polishing stop layer 140 may be formed on the planarized second surface 114 of the substrate 110. The polishing stop layer 140 may be formed of silicon oxide, silicon nitride, silicon carbon nitride, silicon carbon oxynitride (SiCON), etc.

A photoresist layer (not illustrated) may be formed on the polishing stop layer 140, and then, the photoresist layer may be patterned to form the first photoresist pattern 142.

Figure 6:
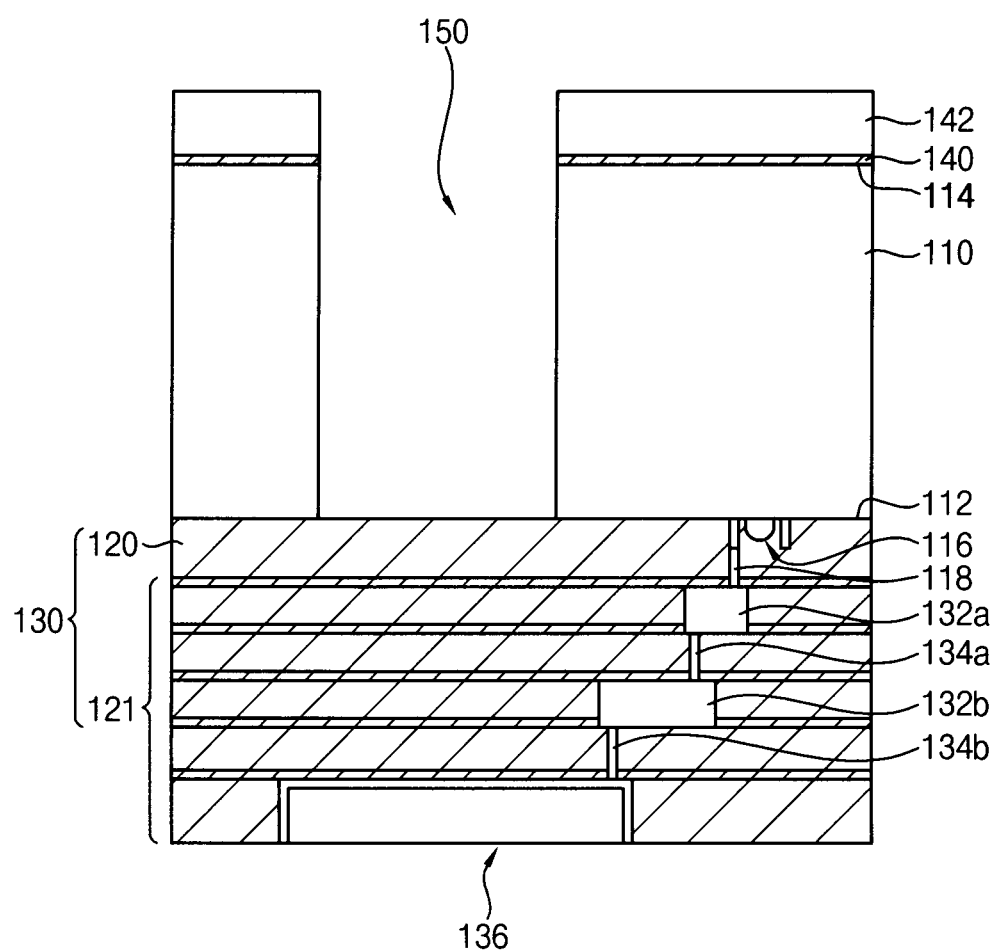

Referring to FIG. 6, a first etch process may be performed on the substrate to form a first opening 150.

The polishing stop layer 140 and the substrate 110 may be partially etched using the first photoresist pattern 142 to expose the insulation interlayer 130. That is, the first etch process may be performed until the insulation interlayer 130 is exposed. Accordingly, the first opening 150 may extend from the second surface 114 to the first surface 112 of the substrate 110.

The first etch process may be performed within a chamber of a first etching apparatus. A first process gas may be supplied into the chamber of the first etching apparatus. For example, the first process gas may include a fluorine gas.

Figure 7:
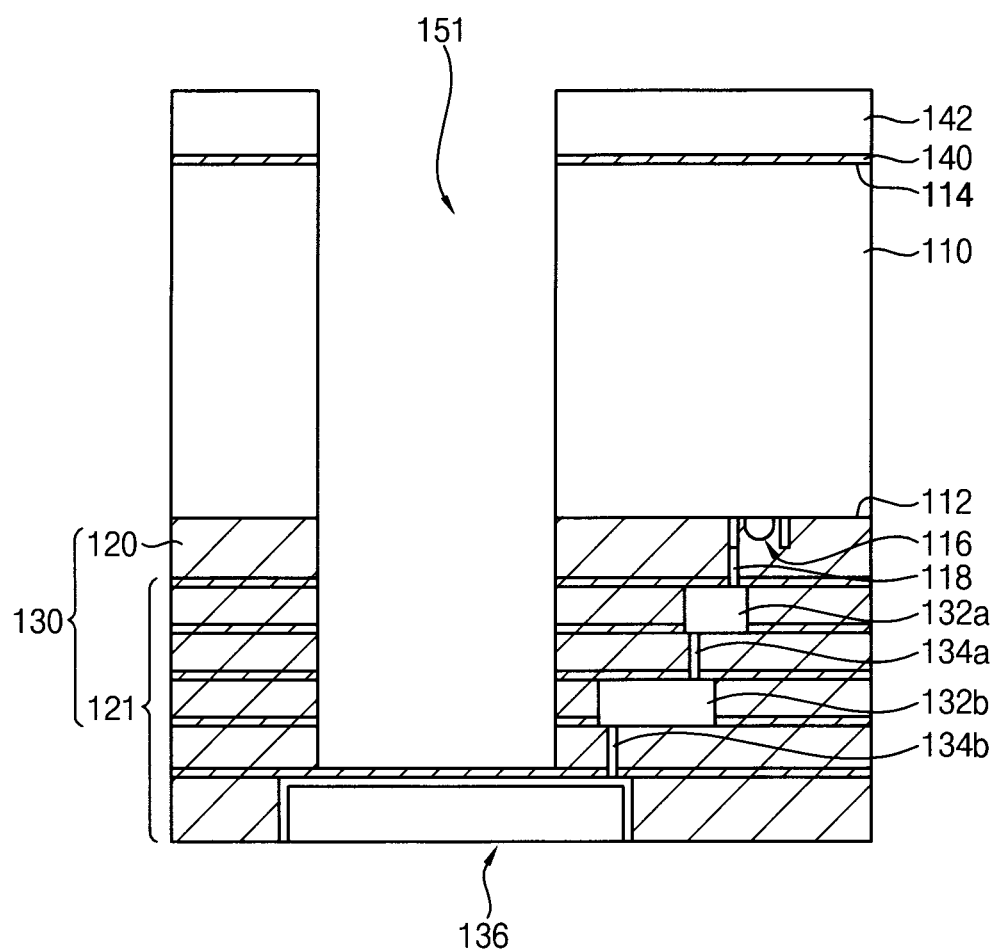
Figure 8:
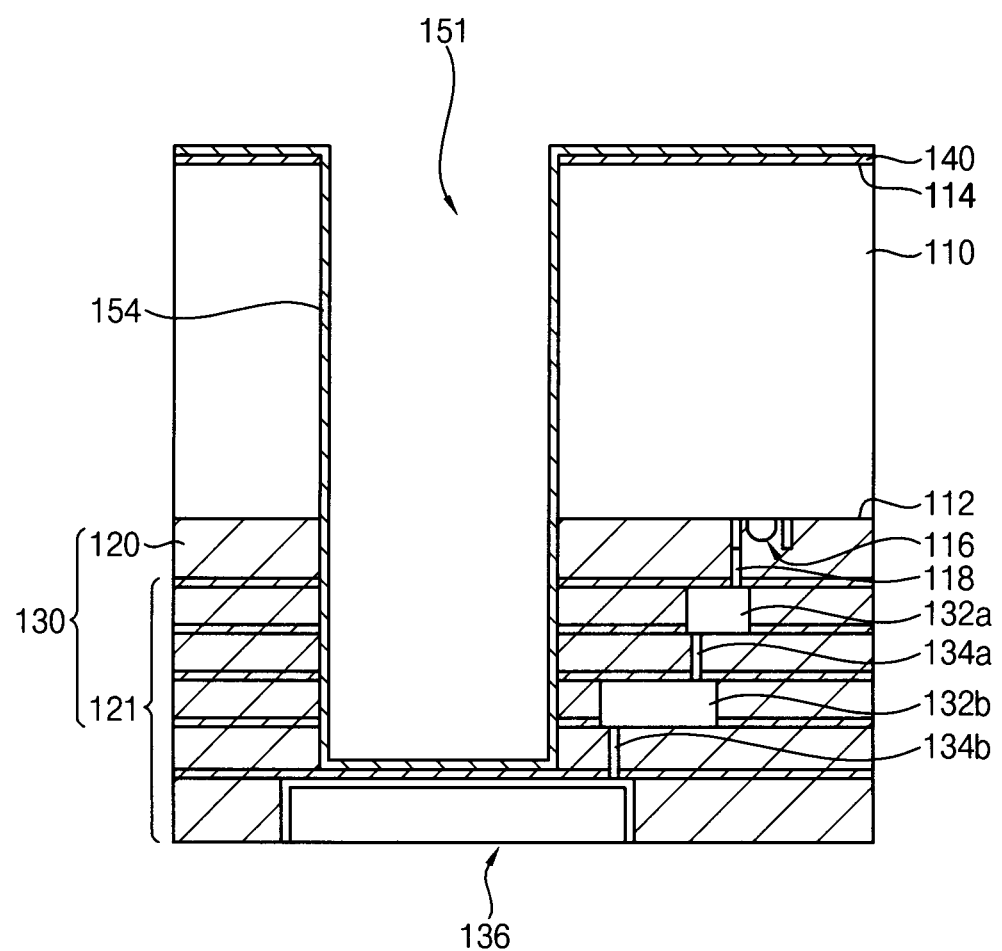
Figure 9:
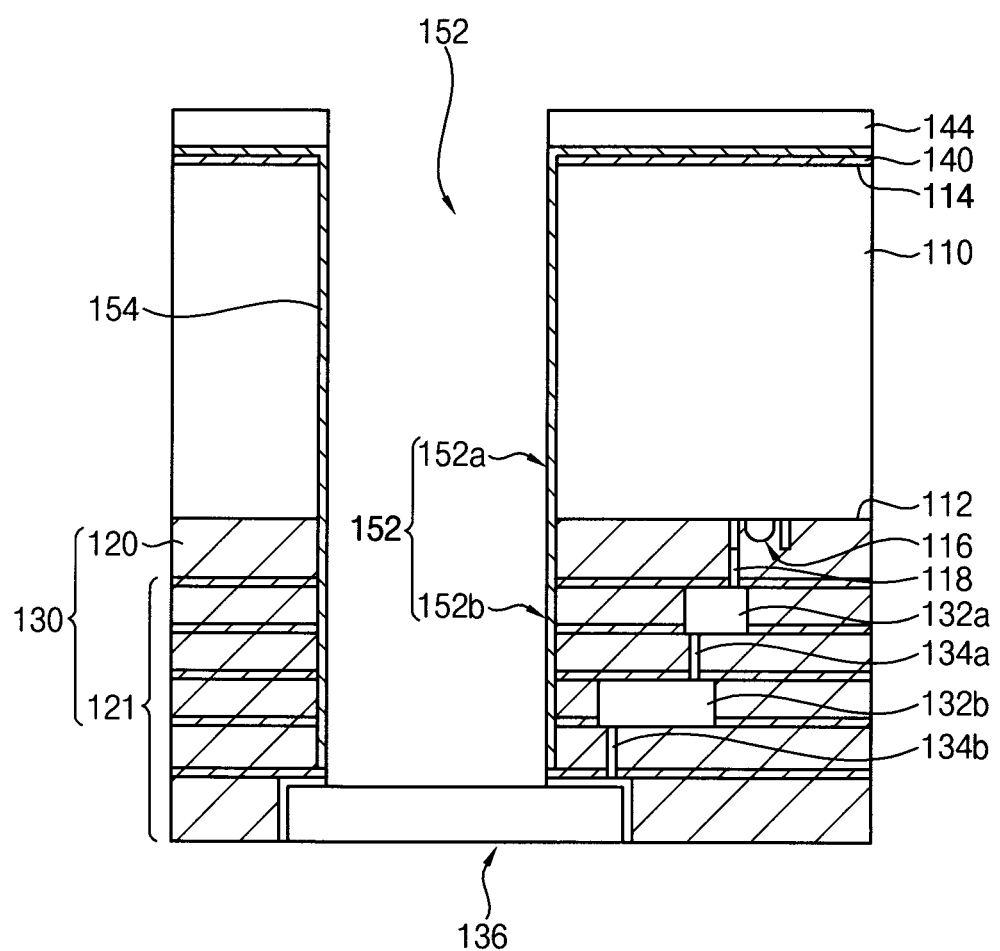

Referring to FIGS. 7 to 9, the insulation interlayer 130 may be partially etched to form a via hole 152 which exposes the first bonding pad 136.

In example embodiments, as illustrated in FIG. 7, firstly, a second etch process may be performed on the insulation interlayer 130 to form a second opening 151. The first insulation interlayer 120 and the second insulation interlayer 121 may be etched to form a second opening 151.

The second opening 151 may be formed to penetrate through the plurality of buffer layers and insulation layers except the outermost insulation layer in which the first bonding pad 136 is provided. For example, the second opening 151 may expose the fifth buffer layer 122e on the outermost insulation layer of the second insulation interlayer 121. Alternatively, the second opening 151 may expose a portion of the fourth insulation layer 124d of the second insulation interlayer 121.

The second etch process may be performed within a chamber of a second etching apparatus. A second process gas different from the first process gas may be supplied into the chamber of the second etching apparatus. For example, the second process gas may include a CF based gas.

After performing the second etch process, the first photoresist pattern 142 may be removed from the substrate 110.

Then, as illustrated in FIG. 8, a liner layer 154 may be formed along a profile of sidewalls and a bottom surface of the second opening 151 and an upper surface of the polishing stop layer 140. The liner layer 154 formed in the second opening 151 may insulate a conductive material within the via hole 152. The liner layer 154 may be formed of silicon oxide or carbon doped silicon oxide.

Referring to FIG. 9, a third etch process may be performed on the liner layer 154 to form the via hole 152. The via hole 152 may penetrate vertically through the substrate 110 and the insulation interlayer 130 to expose the first bonding pad 136. The via hole 152 may include a first via hole 152a penetrating through the substrate 110 and a second via hole 152b penetrating through the insulation interlayer 130 to expose the first bonding pad 136.

The liner layer 154 and the remaining insulation layers of the second insulation interlayer 121 may be etched using a second photoresist pattern 144 as an etching mask to form the via hole 152. That is, the third etch process may be performed until the first bonding pad 136 in the outermost insulation layer is exposed.

A portion of the pad barrier pattern 136a of the first bonding pad 136 may be removed by the third etch process. Accordingly, the via hole 152 may expose the pad conductive pattern 136b of the first bonding pad 136.

After performing the third etch process, the second photoresist pattern 144 may be removed from the substrate 110. The third etch process may be performed without the second photoresist pattern 144.

Figure 10:
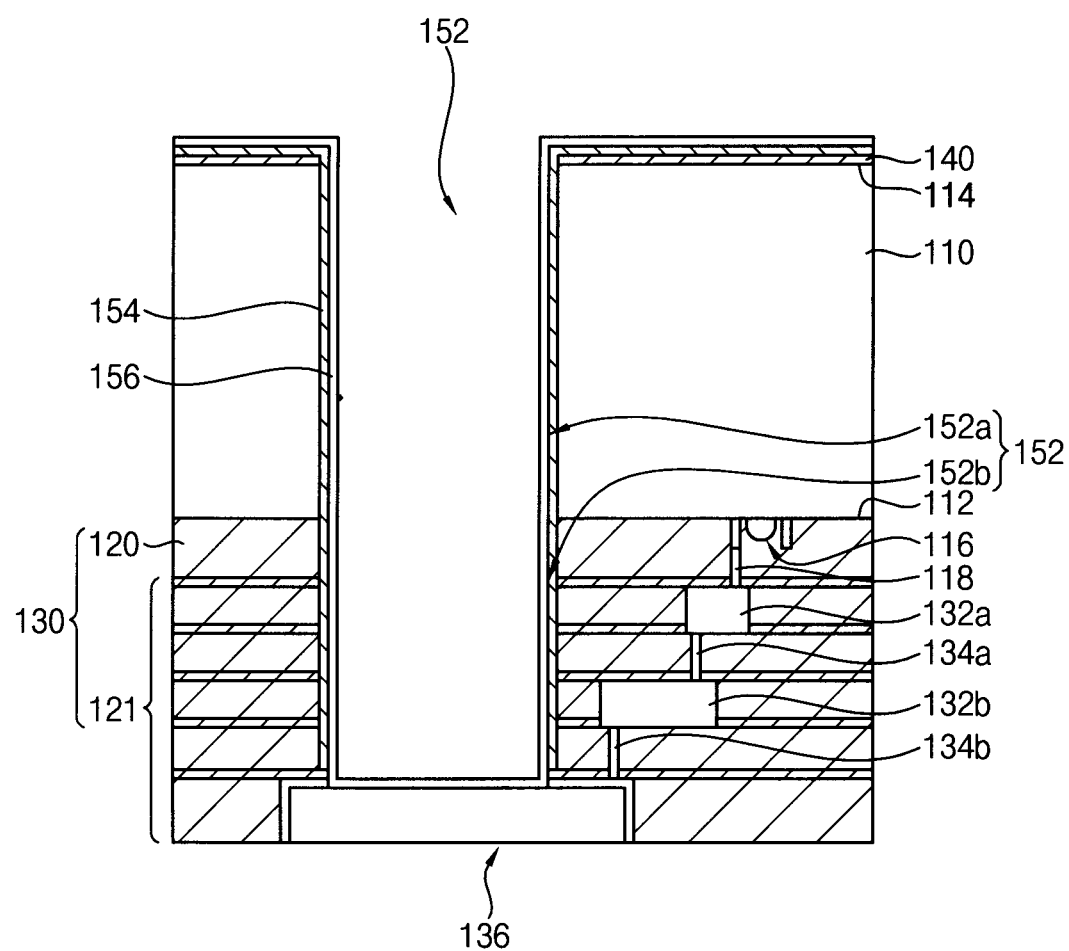
Figure 11:
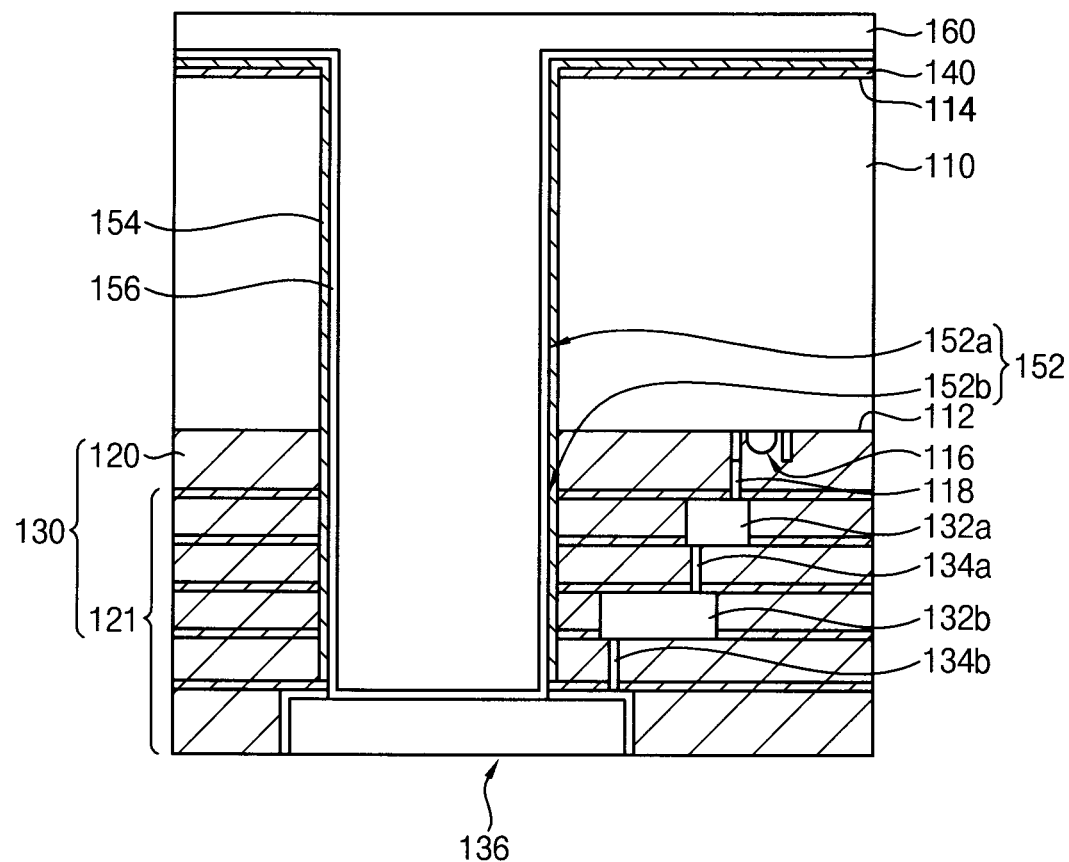
Figure 12:
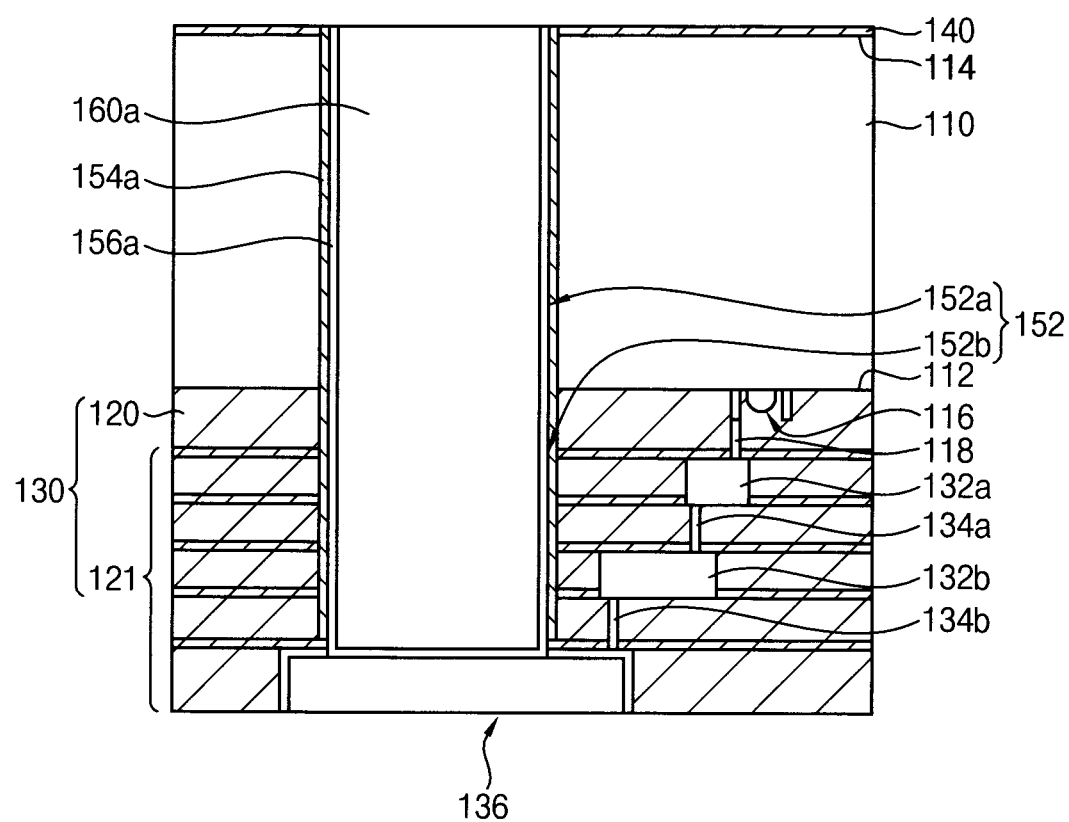

Referring to FIGS. 10 to 12, a TSV, that is, a plug structure may be formed in the via hole 152 to make contact with the first bonding pad 136.

As illustrated in FIG. 10, firstly, a barrier metal layer 156 may be formed on the liner layer 154. The barrier metal layer 156 may be formed to include a metal nitride, e.g., titanium nitride, tantalum nitride, etc. and/or a metal, e.g., titanium, tantalum, etc.

Then, a seed layer (not illustrated) may be formed on the barrier metal layer 156. The seed layer may be used as an electrode in a plating process for forming a following conductive layer 156. As an example, a physical vapor deposition process may be performed to deposit a copper layer as the seed layer.

As illustrated in FIG. 11, a conductive layer 160 may be formed on the seed layer to fill the via hole 152. The conductive layer 160 may be formed using a metal material having a low resistance. For example, the conductive layer 160 may be formed using copper by an electro plating process, an electroless plating process, an electrografting process, a physical vapor deposition process, etc. After forming the conductive layer 160, a thermal treatment process may be further performed on the conductive layer 160.

Alternatively, the conductive layer 160 may be formed using a metal material other than copper. The conductive layer may include aluminum (Al), gold (Au), indium (In), nickel (Ni), etc. However, the conductive layer may include preferably, but not necessarily, copper having a low resistance which are suitable for Cu—Cu Hybrid bonding process.

As illustrated in FIG. 12, a chemical mechanical polish process may be performed on the conductive layer 160, the barrier metal layer 156 and the liner layer 154 to form the TSV (plug structure). The plug structure may include a barrier pattern 156a and a conductive pattern 160a. Here, a portion of the polishing stop layer 140 may remain. The barrier pattern 156a of the plug structure may make contact with the pad conductive pattern 136b of the first bonding pad 136.

Accordingly, the TSV may contact directly with the first bonding pad 136 in the outermost insulation layer.

Figure 13:
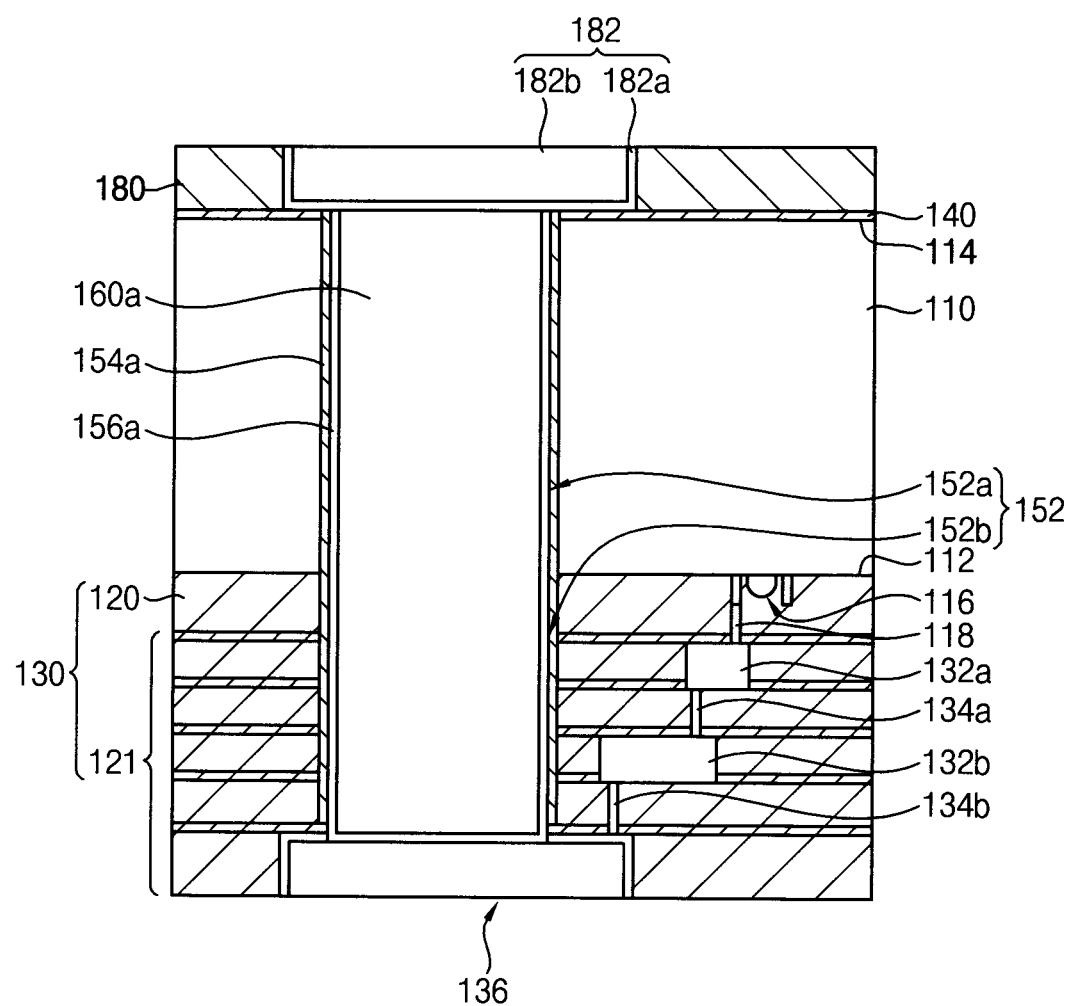

Referring to FIG. 13, an insulation layer 180 having a second bonding pad 182 may be formed on the second surface 114 of the substrate 110. The second bonding pad 182 may be formed on an upper surface of the plug structure.

The insulation layer 180 may be formed on the second surface 114 of the substrate 110, and then, the insulation layer 180 may be partially etched to form a fourth trench which exposes the upper surface of the plug structure, and the second bonding pad 182 may be formed in the fourth trench. A pad barrier pattern 182a and a pad conductive pattern 182b may be formed in the fourth trench. The pad conductive pattern 182b may be formed on the pad barrier pattern 182a to fill the fourth trench.

The pad conductive pattern 182b may include copper (Cu), aluminum (Al), gold (Au), indium (In), nickel (Ni), etc. These may be used alone or in a mixture thereof. In this embodiment, the pad conductive pattern 182b may include copper. For example, the insulation layer 180 may be formed of silicon oxide, silicon nitride, silicon carbon nitride (SiCN), silicon carbon oxynitride (SiCON), etc.

Figure 14:
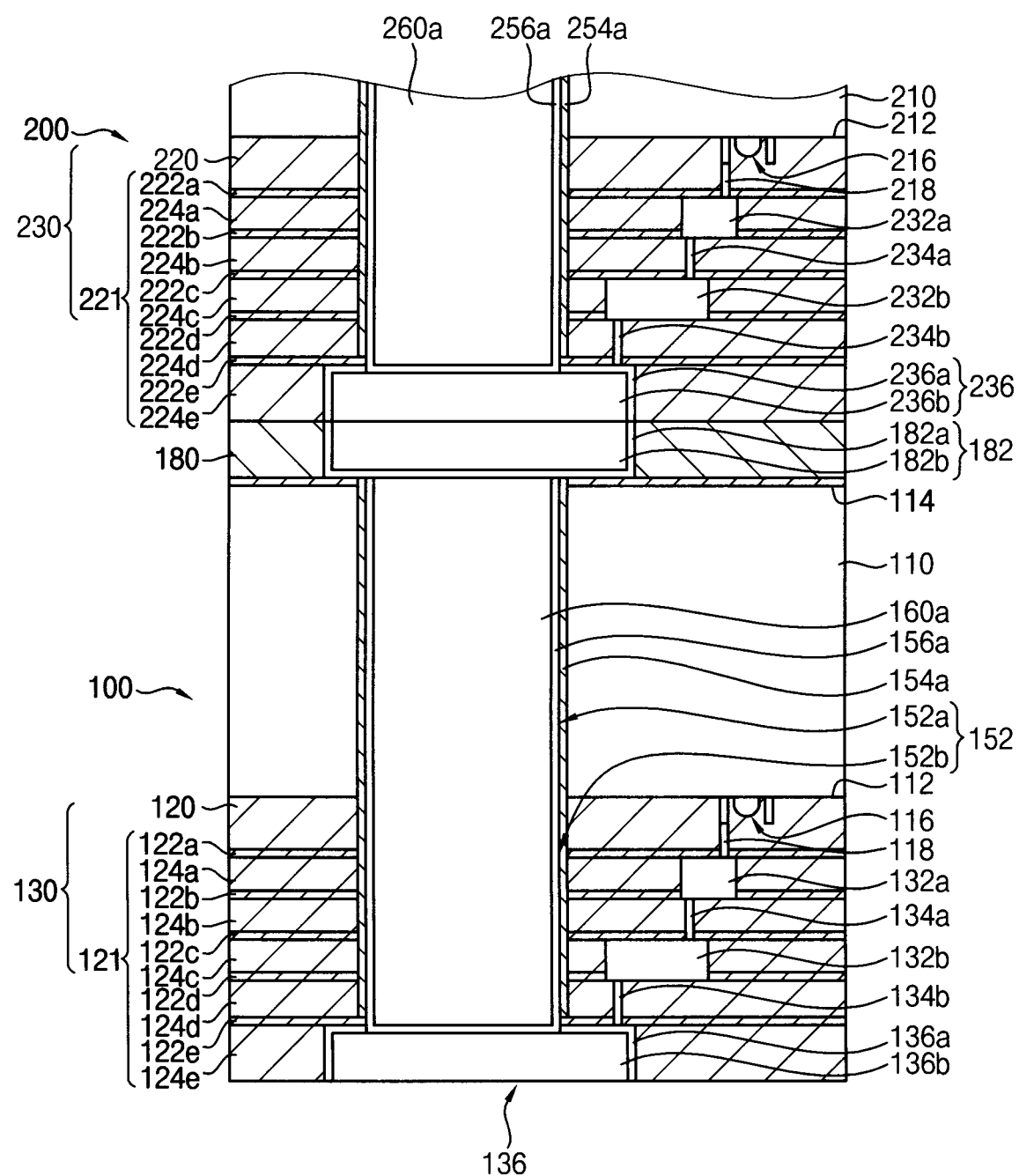

Referring to FIG. 14, a second wafer may be bonded on the first wafer to stack a second semiconductor chip 200 of the second wafer on a first semiconductor chip 100. Then, similarly, third and fourth semiconductor chips 300, 400 of third and fourth wafers may be sequentially stacked on the second semiconductor chip 200 of the second wafer, and then, the stacked wafers may be sawed to complete a semiconductor package 10 as a stack semiconductor device in FIG. 1.

In example embodiments, the second bonding pad 182 in an outermost insulation layer of the first semiconductor chip 100 may be bonded to a first bonding pad 236 in an outermost insulation layer of the second semiconductor chip 200.

The second bonding pad 182 of the first semiconductor chip 100 may be bonded to the first bonding pad 236 of the second semiconductor chip 200 by Cu—Cu hybrid bonding process. Here, a thermal treatment process may be performed together. By the thermal treatment process, the pad conductive pattern 182b of the second bonding pad 182 of the first semiconductor chip 100 and the pad conductive pattern 236b of the first bonding pad 236 of the second semiconductor chip 200 may be expanded thermally to be in contact with each other.

In example embodiments, when the first wafer including the first semiconductor chip 100 and the second wafer including the second semiconductor chip 200 are bonded to each other by wafer-to-wafer bonding, the second bonding pad 182 of the first semiconductor chip 100 and the first bonding pad 236 of the second semiconductor chip 200 may be joined to each other by Cu—Cu hybrid bonding.

When the TSV is formed after forming the metal wiring layer (via last process), the TSV may be formed such that the TSV is landed directly on the bonding pad 136 in the outermost insulation layer, not the first metal wiring 132a (M1 metal).

Because the thickness of the bonding pad 136 is greater than the thickness of the first metal wiring 132a, copper (Cu) punch-through may be prevented from occurring due to total thickness variation (TTV) in a CMP process.

Figure 15:
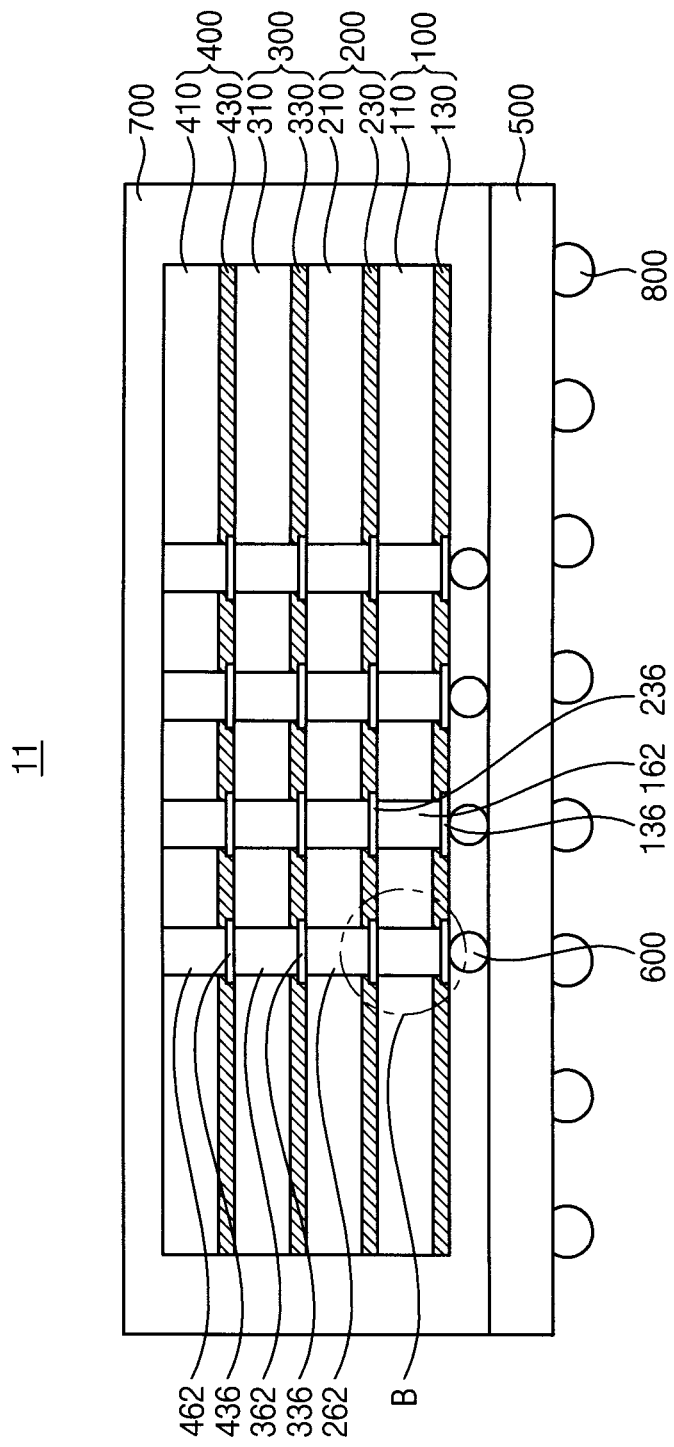
Figure 16:
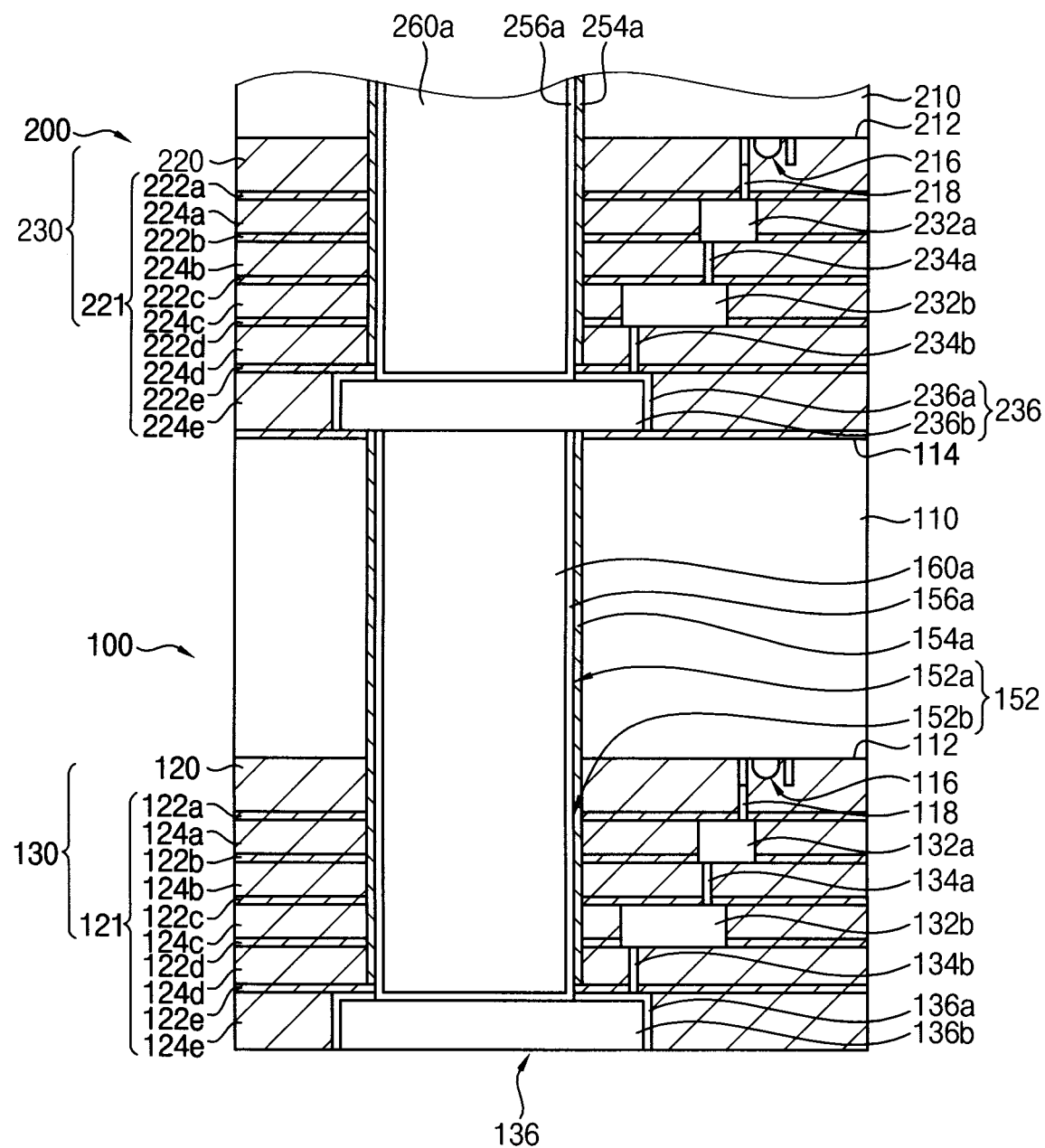

FIG. 15 is a cross-sectional view illustrating a semiconductor package in accordance with example embodiments. FIG. 16 is an enlarged cross-sectional view illustrating "B" portion in FIG. 15. The semiconductor package may be substantially the same as or similar to the semiconductor package described with reference to FIG. 1 except for configurations of semiconductor devices. Thus, same reference numerals will be used to refer to the same or like elements and any further repetitive explanation concerning the above elements will be omitted.

Referring to FIGS. 15 and 16, a semiconductor package 11 may include first to fourth semiconductor chips 100, 200, 300, 400 stacked on a package substrate 500.

The first semiconductor chip 100 may include a substrate 110, an insulation interlayer 130, a bonding pad 136 and a plug structure 162. Similarly, the second semiconductor chip 200 may include a substrate 210, an insulation interlayer 230, a bonding pad 236 and a plug structure 262.

The second semiconductor chip 200 may be arranged on the first semiconductor chip such that the bonding pad 236 of the second semiconductor chip 200 faces an exposed upper surface of the plug structure 162 of the first semiconductor chip 100.

A conductive pattern 160a of the plug structure 162 of the first semiconductor chip 100 and the bonding pad 236 of the second semiconductor chip 200 may be bonded to each other by Cu—Cu hybrid bonding.

Similarly, the plug structure 262 of the second semiconductor chip 200 and a bonding pad 336 of the third semiconductor chip 300 may be bonded to each other by Cu—Cu hybrid bonding. A plug structure 362 of the third semiconductor chip 300 and a bonding pad 436 of the fourth semiconductor chip 400 may be bonded to each other by Cu—Cu hybrid bonding.

Accordingly, the stacked semiconductor chips may have pad-to-TSV interconnection structure.

Hereinafter, a method of manufacturing the semiconductor package in FIG. 15 will be explained.

First, processes described with reference to FIGS. 3 to 12 may be performed to form an insulation interlayer 130 on a first surface 112 of a substrate 110 of a first wafer, and then, a TSV may be formed to extend from a second surface 114 of the substrate 110 and make contact with an outermost bonding pad 136 of the insulation interlayer 130.

Then, a second wafer may be bonded on the first wafer to stack a second semiconductor chip 200 of the second wafer on the first semiconductor chip 100 of the first wafer. Then, similarly, third and fourth semiconductor chips 300, 400 of third and fourth wafers may be sequentially stacked on the second semiconductor chip 200 of the second wafer, and then, the stacked wafers may be sawed to complete a semiconductor package 11 as a stack semiconductor device in FIG. 15.

In example embodiments, a conductive pattern 160a of the plug structure 162 of the first semiconductor chip 100 and a bonding pad 236 in an outermost insulation layer of the second semiconductor chip 200 may be bonded to each other.

The plug structure 162 of the first semiconductor chip 100 and the bonding pad 236 of the second semiconductor chip 200 may be bonded to each other by Cu—Cu hybrid bonding process. Here, a thermal treatment process may be performed together. By the thermal treatment process, the conductive pattern 160a of the first semiconductor chip 100 and a pad conductive pattern 236b of the second semiconductor chip 200 may be expanded thermally to be in contact with each other.

In example embodiments, when the first wafer including the first semiconductor chip 100 and the second wafer including the second semiconductor chip 200 are bonded to each other by wafer-to-wafer bonding, the TSV of the first semiconductor chip 100 and the bonding pad 236 of the second semiconductor chip 200 may be joined to each other by Cu—Cu hybrid bonding.

Figure 17:
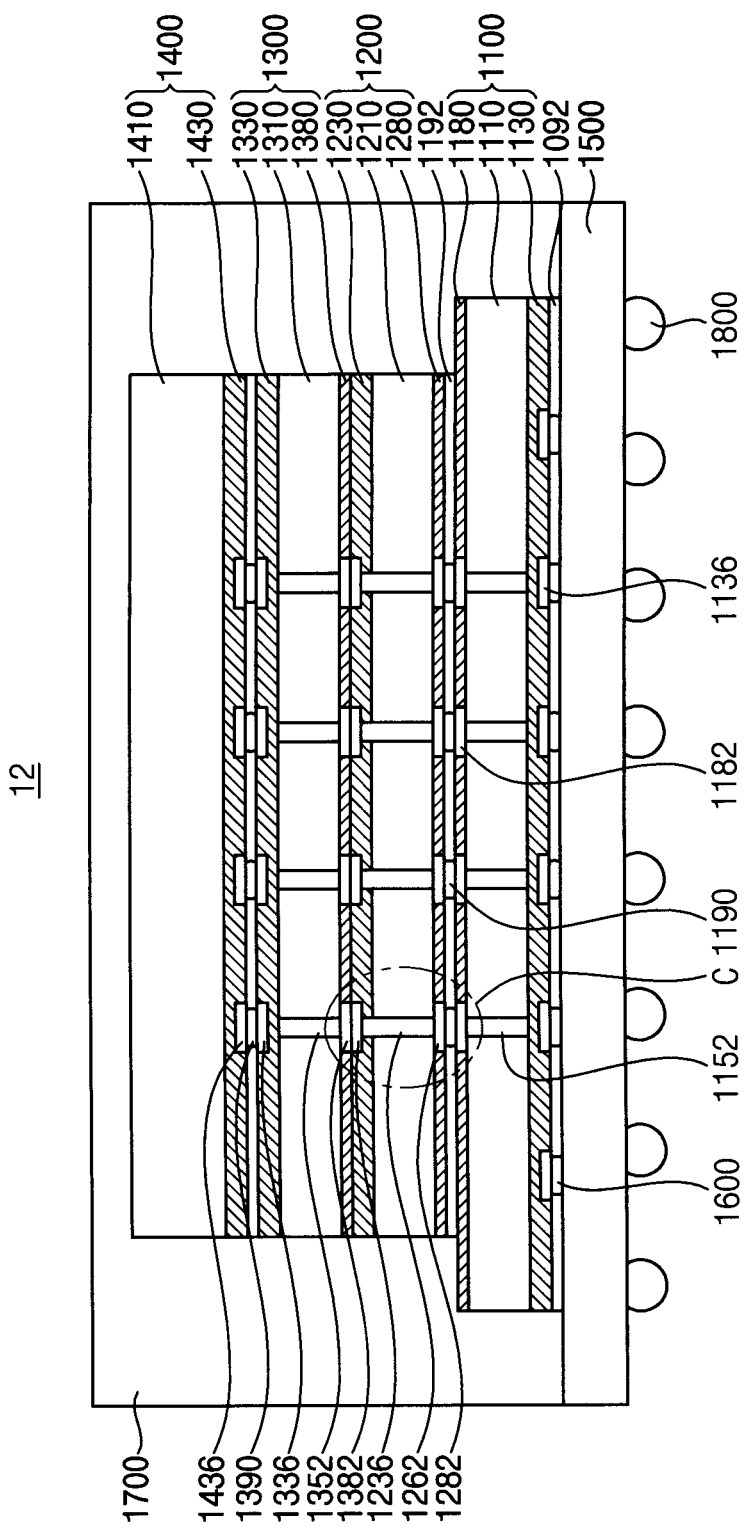
Figure 18:
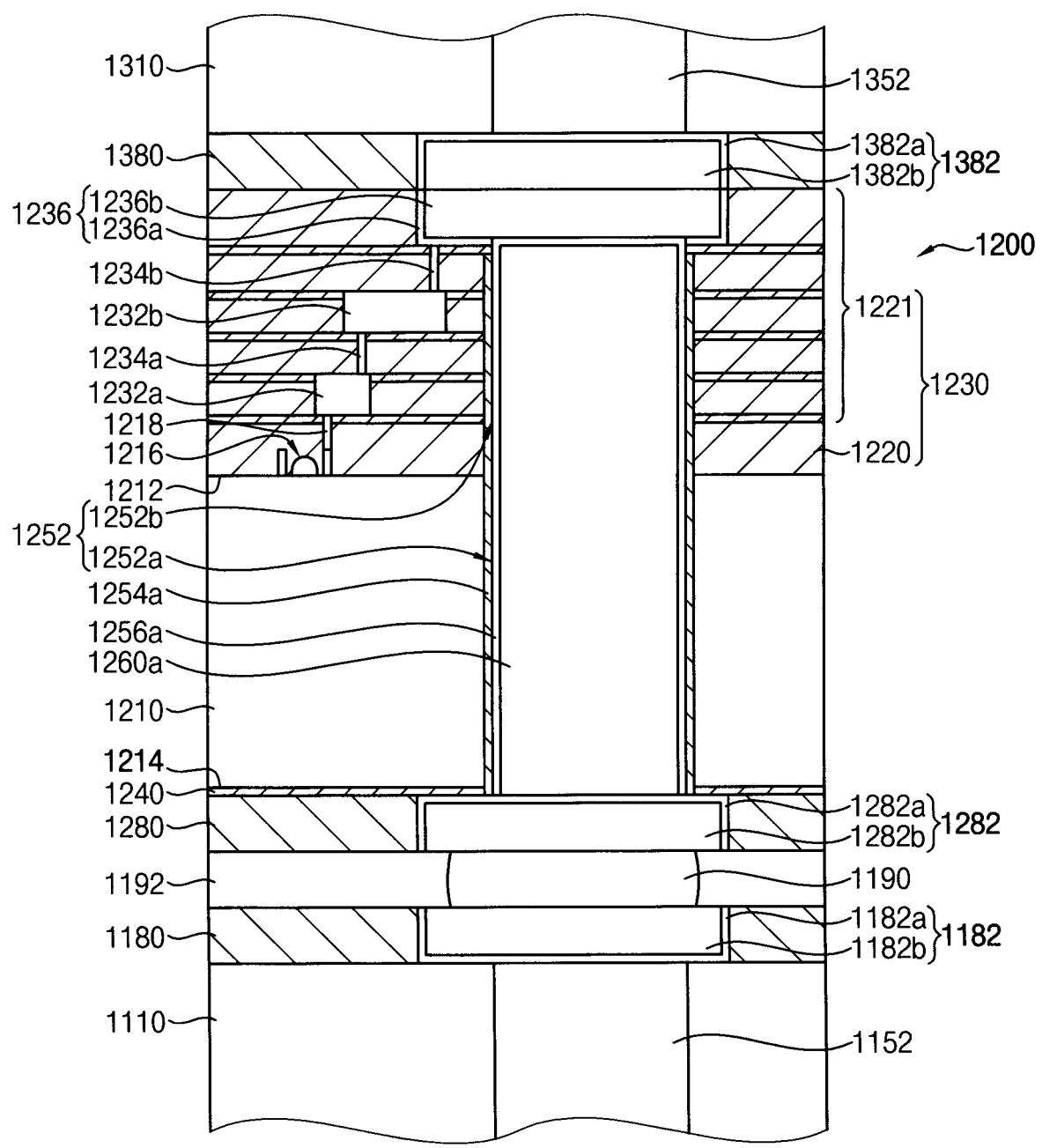

FIG. 17 is a cross-sectional view illustrating a semiconductor package in accordance with example embodiments. FIG. 18 is an enlarged cross-sectional view illustrating "C" portion in FIG. 17. The semiconductor package may be substantially the same as or similar to the semiconductor package described with reference to FIG. 1 except for configurations of semiconductor devices. Thus, same reference numerals will be used to refer to the same or like elements and any further repetitive explanation concerning the above elements will be omitted.

Referring to FIGS. 17 and 18, a semiconductor package 12 may include a plurality of stacked semiconductor chips. The semiconductor package 12 may include a High Bandwidth Memory (HBM) device.

In example embodiments, the semiconductor package 12 may include a buffer die 1100 and first to third memory dies 1200, 1300, 1400 sequentially stacked on the buffer die 1100. The buffer die 1100 and the first to third memory dies 1200, 1300, 1400 may be electrically connected to one another by TSVs. The buffer die 1100 and the first to third memory dies 1200, 1300, 1400 may communicate data signals and control signals with one another through the TSVs. In this embodiment, the HBM device including four stacked dies (chips) are exemplarily illustrated, but, the inventive concept may not be limited thereto.

The buffer die 1100 may include a substrate 1110, an insulation interlayer 1130, a first bonding pad 1136, a second bonding pad 1182 and a TSV, that is, a plug structure 1152. The insulation interlayer 1130 may be provided on a first surface, that is, an active surface of the substrate 1110. The first bonding pad 1136 may be provided in an outermost insulation layer of the insulation interlayer 1130. The plug structure 1152 may be provided to penetrate through the substrate 1110. A lower surface of the plug structure 1152 may be in contact with a first metal wiring of the insulation interlayer 1130. The plug structure 1152 may be electrically connected to the first bonding pad 1136 through a wiring structure including the first metal wiring in the insulation interlayer 1130.

The first memory die 1200 may include a substrate 1210, an insulation interlayer 1230, a first bonding pad 1236, a second bonding pad 1282 and a TSV, that is, a plug structure 1262. The insulation interlayer 1230 may be provided on a first surface, that is, an active surface of the substrate 1210. The first bonding pad 1236 may be provided in an outermost insulation layer of the insulation interlayer 1230. The plug structure 1262 may be provided to penetrate through the substrate 1210. An upper surface of the plug structure 1262 may be in contact with the bonding pad 1236 of the insulation interlayer 1230. A lower surface of the plug structure 1262 may be in contact with the second bonding pad 1282.

The second memory die 1300 may include a substrate 1310, an insulation interlayer 1330, a first bonding pad 1336, a second bonding pad 1382 and a TSV, that is, a plug structure 1352. The insulation interlayer 1330 may be provided on a first surface, that is, an active surface of the substrate 1310. The first bonding pad 1336 may be provided in an outermost insulation layer of the insulation interlayer 1330. The plug structure 1352 may be provided to penetrate through the substrate 1310. An upper surface of the plug structure 1352 may be in contact with a first metal wiring of the insulation interlayer 1330. A lower surface of the plug structure 1352 may be in contact with the second bonding pad 1382. The plug structure 1352 may be electrically connected to the first bonding pad 1336 through a wiring structure including the first metal wiring in the insulation interlayer 1330.

The third memory die 1400 may include a substrate 1410, an insulation interlayer 1430 and a bonding pad 1436. The insulation interlayer 1430 may be provided on a first surface, that is, an active surface of the substrate 1410. The bonding pad 1436 may be provided in an outermost insulation layer of the insulation interlayer 1430.

Conductive bumps 1600 may be interposed between a package substrate 1500 and the buffer die 1100. The conductive bump 1600 may be interposed between a substrate pad of the package substrate 1500 and the first bonding pad 1136 of the buffer die 1100 to electrically connect them each other.

Conductive bumps 1190 may be interposed between the buffer die 1100 and the first memory die 1200. The conductive bump 1190 may be interposed between the second bonding pad 1182 of the buffer die 1100 and the second bonding pad 1282 of the first memory die 1200 to electrically connect them each other.

The first bonding pad 1236 of the first memory die 1200 and the second bonding pad 1382 of the second memory die 1300 may be in contact with each other. The first bonding pad 1236 of the first memory die 1200 and the second bonding pad 1382 of the second memory die 1300 may be bonded to each other by Cu—Cu hybrid bonding.

Conductive bumps 1390 may be interposed between the second memory die 1300 and the third memory die 1400. The conductive bump 1390 may be interposed between the first bonding pad 1336 of the second memory die 1300 and the first bonding pad 1436 of the third memory die 1400 to electrically connect them each other.

A molding member 1700 may be provided on the package substrate 1500 to cover the buffer die 1100 and the first to third memory dies 1200, 1300, 1400. The molding member 1700 may include an epoxy molding compound (EMC) material.

As mentioned above, the HBM memory device may include a plurality of stacked dies 1100, 1200, 1300, 1400. The first bonding pad 1236 of the first memory die 1200 may be bonded to the second bonding pad 1382 of the second memory die 1300 by Cu—Cu hybrid bonding. The plug structure 1260 penetrating through the substrate 1210 of the first memory die 1200 may make contact with the first bonding pad 1236 which is provided in the outermost insulation layer to be exposed through an upper surface of the first memory die 1200.

Hereinafter, a method of manufacturing the semiconductor package in FIG. 17 will be explained.

FIGS. 19 to 34 are cross-sectional views illustrating a method of manufacturing a semiconductor package in accordance with example embodiments. FIG. 23 is an enlarged cross-sectional view illustrating "D" portion in FIG. 22. FIG. 25 is an enlarged cross-sectional view illustrating "E" portion in FIG. 24. FIG. 27 is an enlarged cross-sectional view illustrating "F" portion in FIG. 26. FIG. 29 is an enlarged cross-sectional view illustrating "G" portion in FIG. 28. FIG. 31 is an enlarged cross-sectional view illustrating "H" portion in FIG. 30.

Figure 19:
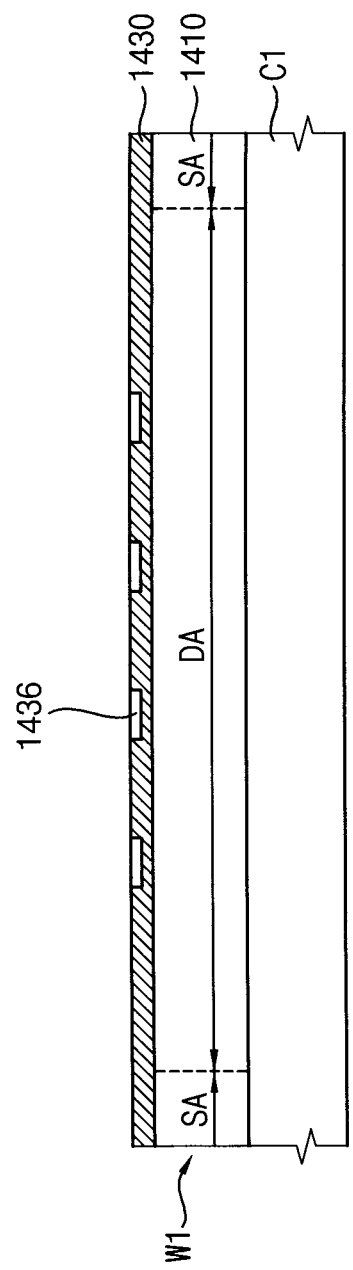
Figure 20:
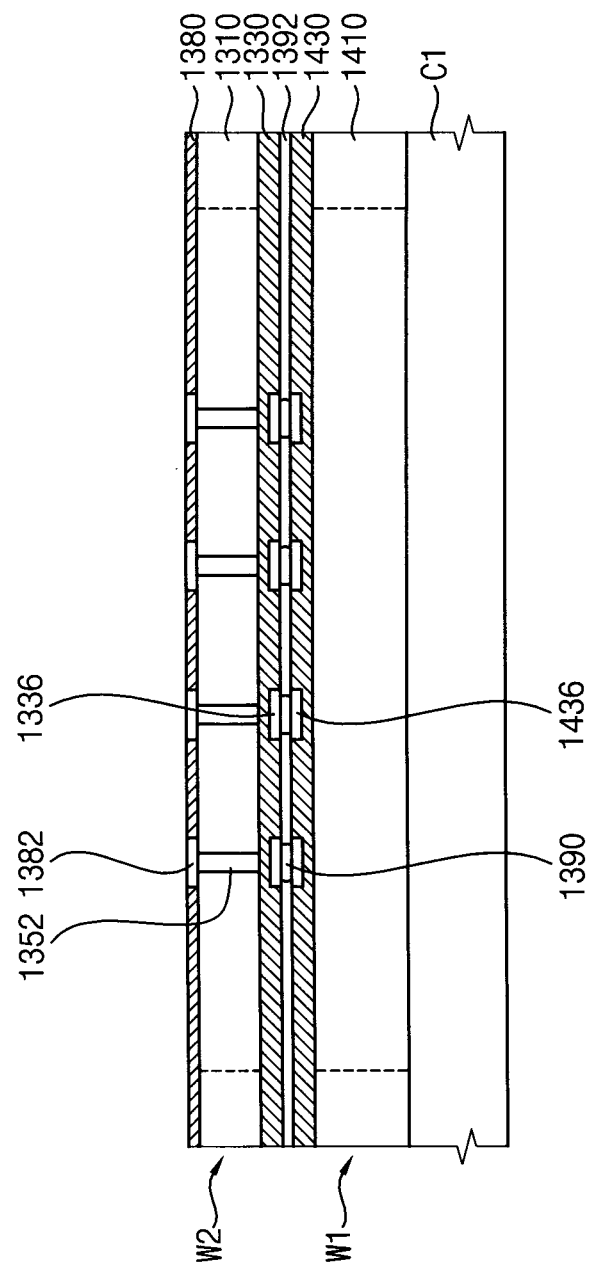

Referring to FIGS. 19 and 20, a second wafer W2 may be stacked on a first wafer W1.

In example embodiments, the first wafer W1 may be arranged on a first carrier substrate C1, and then, the second wafer W2 may be stacked on the first wafer W1.

The first wafer W1 may include a substrate 1410, an insulation interlayer 1430 and a bonding pad 1436. The insulation interlayer 1430 may be provided on a first surface of the substrate 1410. The bonding pad 1436 may be provided in an outermost insulation layer of the insulation interlayer 1430. The substrate 1410 may include a die region DA where circuit patterns and cells are formed and a scribe lane region SA surrounding the die region DA. The substrate 1410 of the first wafer W1 may be sawed along the scribe lane region SA dividing a plurality of the die regions DA.

The second wafer W2 may include a substrate 1310, an insulation interlayer 1330, a first bonding pad 1336, a second bonding pad 1382 and a plug structure 1352. The insulation interlayer 1330 may be provided on a first surface of the substrate 1310. The first bonding pad 1336 may be provided in an outermost insulation layer of the insulation interlayer 1330. The second bonding pad 1382 may be provided in an insulation layer 1380 on a second surface opposite to the first surface of the substrate 1310.

The second wafer W2 may be stacked on the first wafer W1 such that the first surface, i.e., an active surface of the substrate 1310 of the second wafer W2 faces the first surface, i.e., an active surface of the substrate 1410 of the first wafer W1. The second wafer W2 may be adhered on the first wafer W1 using an adhesive film such as a non-conductive film. The second wafer W2 may be stacked on the first wafer W1 via conductive bumps 1390 interposed between the first wafer W1 and the second wafer W2. The bonding pad 1436 of the first wafer W1 may be electrically connected to the first bonding pad 1336 of the second wafer W2 through the conductive bump 1390.

The first wafer W1 may not include a TSV. A backside of the substrate 1410 of the first wafer W1 may not be grinded.

A thickness of the substrate 1410 of the first wafer W1 may be greater than a thickness of the substrate 1310 of the second wafer W2.

Figure 21:
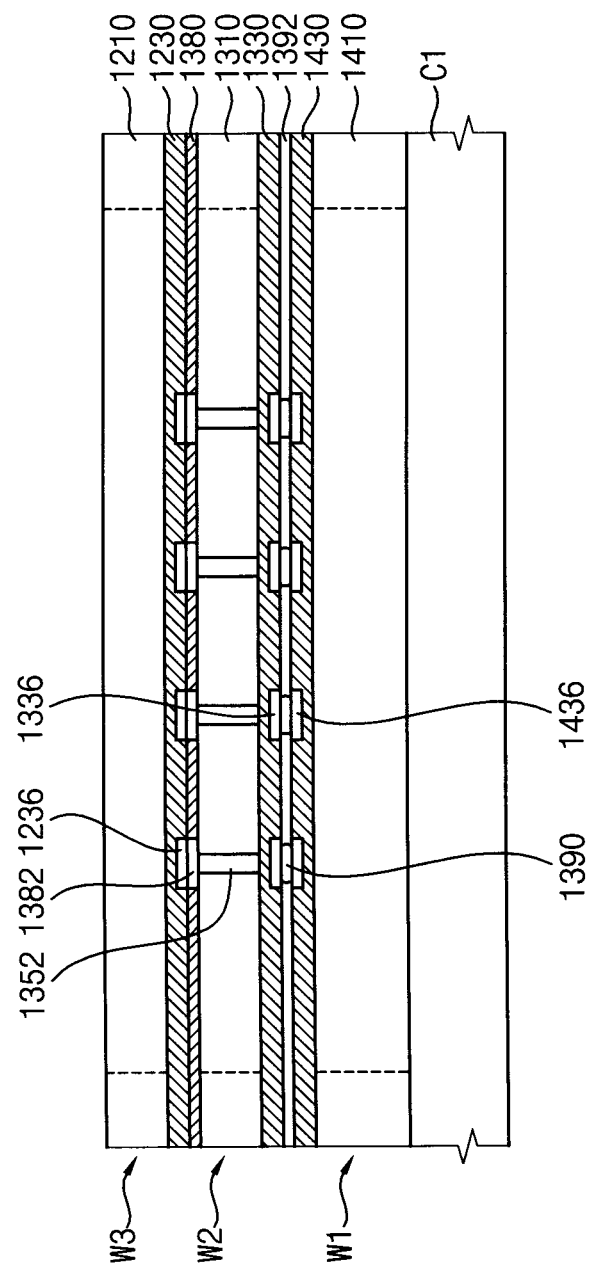

Referring to FIG. 21, a third wafer W3 may be stacked on the second wafer W2.

In example embodiments, the third wafer W3 may include a substrate 1210, an insulation interlayer 1230 and a first bonding pad 1236. The insulation interlayer 1230 may be provided on a first surface of the substrate 1210. The first bonding pad 1236 may be provided in an outermost insulation layer of the insulation interlayer 1230.

The third wafer W3 may be stacked on the second wafer W2 such that the first surface, i.e., an active surface of the substrate 1210 of the third wafer W3 faces the second wafer W2. The first bonding pad 1236 of the third wafer W3 may make contact with the second bonding pad 1382 of the second wafer W2. When the second wafer W2 and the third wafer W3 are bonded to each other by wafer-to-wafer bonding, the second bonding pad 1382 of the second wafer W2 and the first bonding pad 1236 of the third wafer W3 may be joined to each other by Cu—Cu hybrid bonding.

Figure 22:
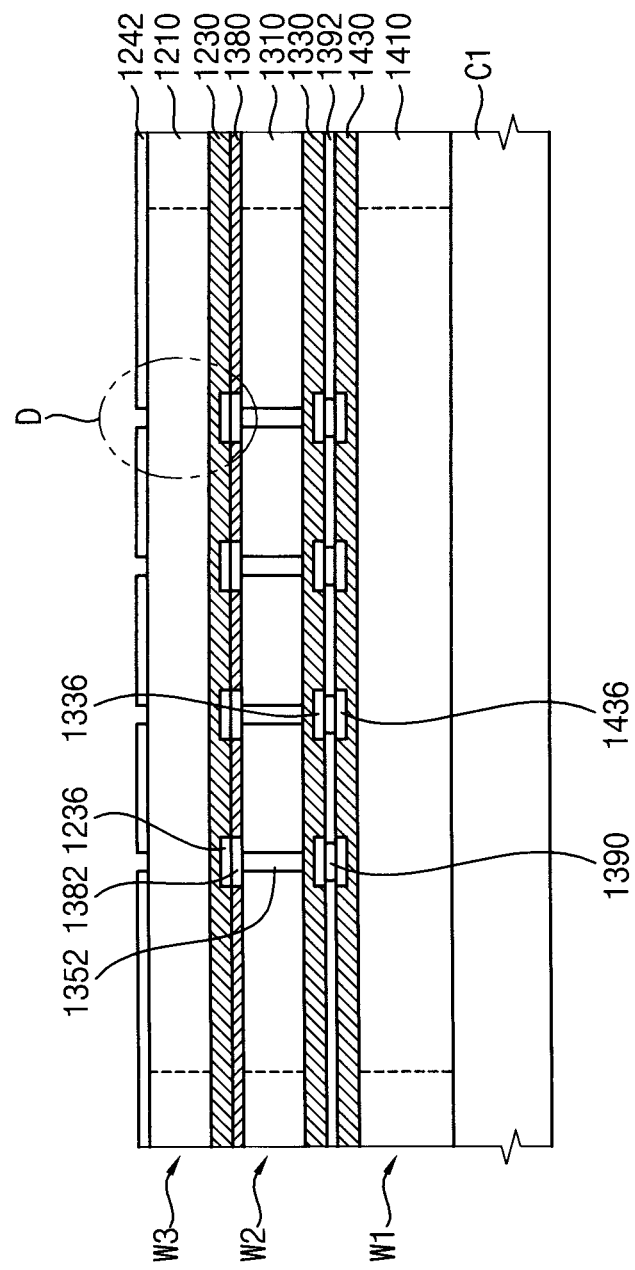
Figure 23:
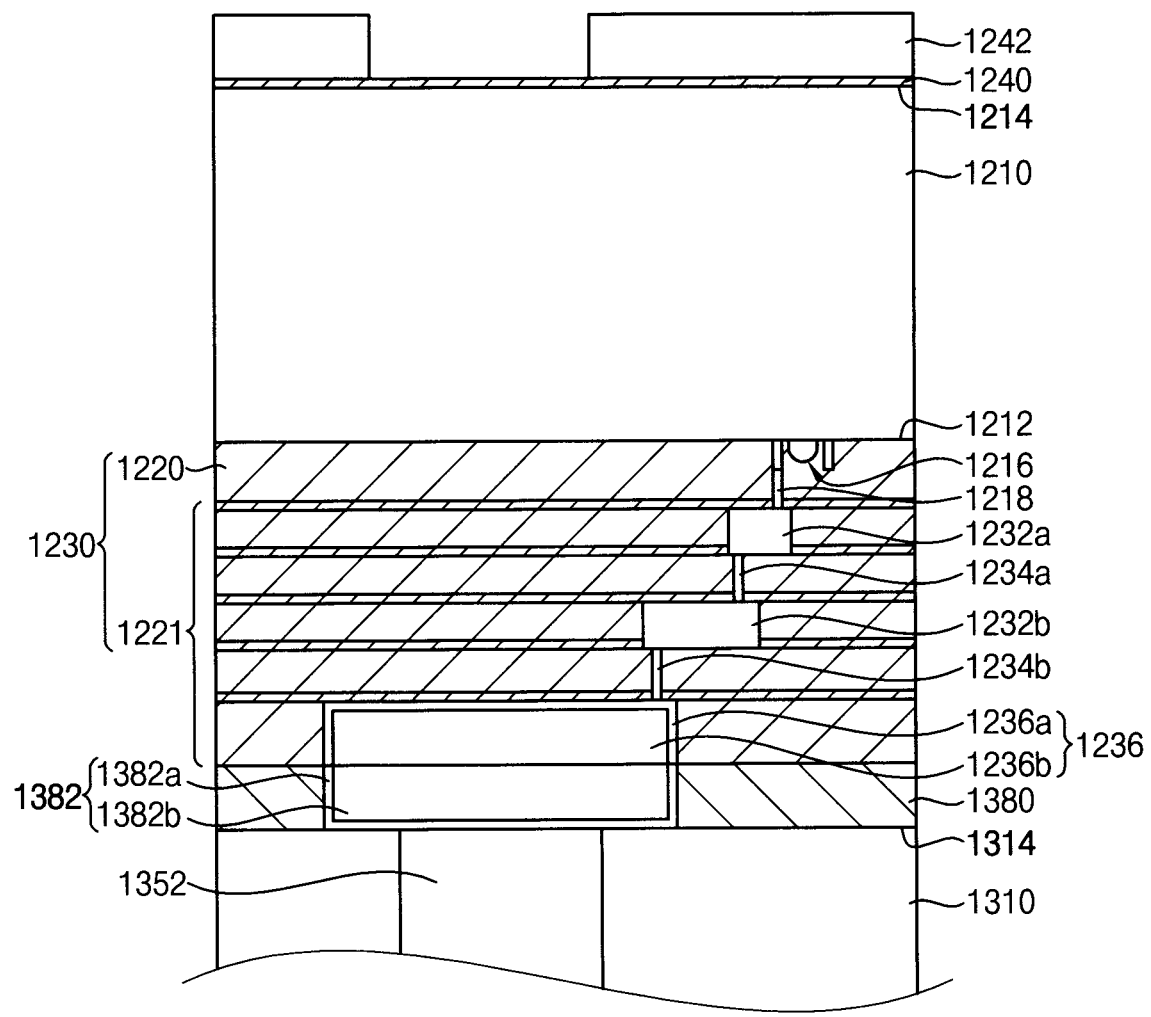

Referring to FIGS. 22 and 23, a first photoresist pattern 1242 for an etch process may be formed on a second surface 1214 of the substrate 1201 of the third wafer W3.

In example embodiments, before forming the first photoresist pattern 1242, the second surface 1214 of the substrate 1210 may be planarized to control a thickness of the substrate 1210. For example, the second surface 1214 of the substrate 1210 may be partially removed by a grinding process. The thickness of the substrate 1210 may be determined considering a thickness of a TSV, that is, a via electrode, to be formed, a thickness of a stack package, etc.

Additionally, a polishing stop layer 1240 may be formed on the planarized second surface 1214 of the substrate 1210. The polishing stop layer 1240 may be formed of silicon oxide, silicon nitride, silicon carbon nitride, silicon carbon oxynitride (SiCON), etc.

A photoresist layer (not illustrated) may be formed on the polishing stop layer 1240, and then, the photoresist layer may be patterned to form the first photoresist pattern 142.

Figure 24:
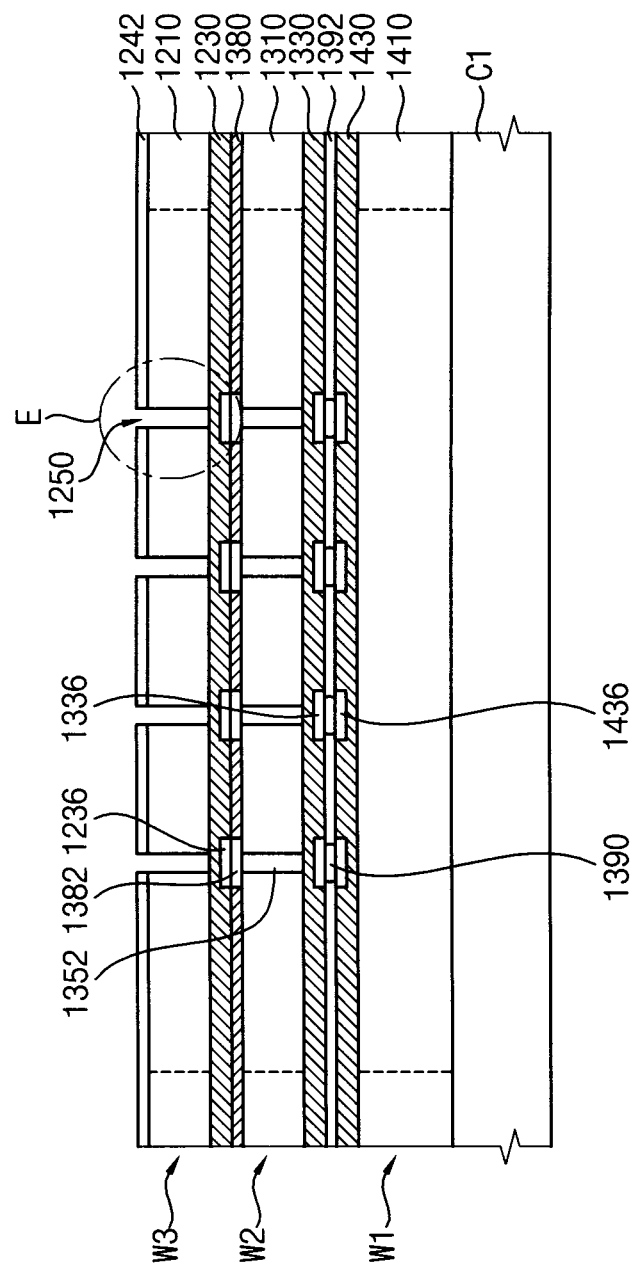
Figure 25:
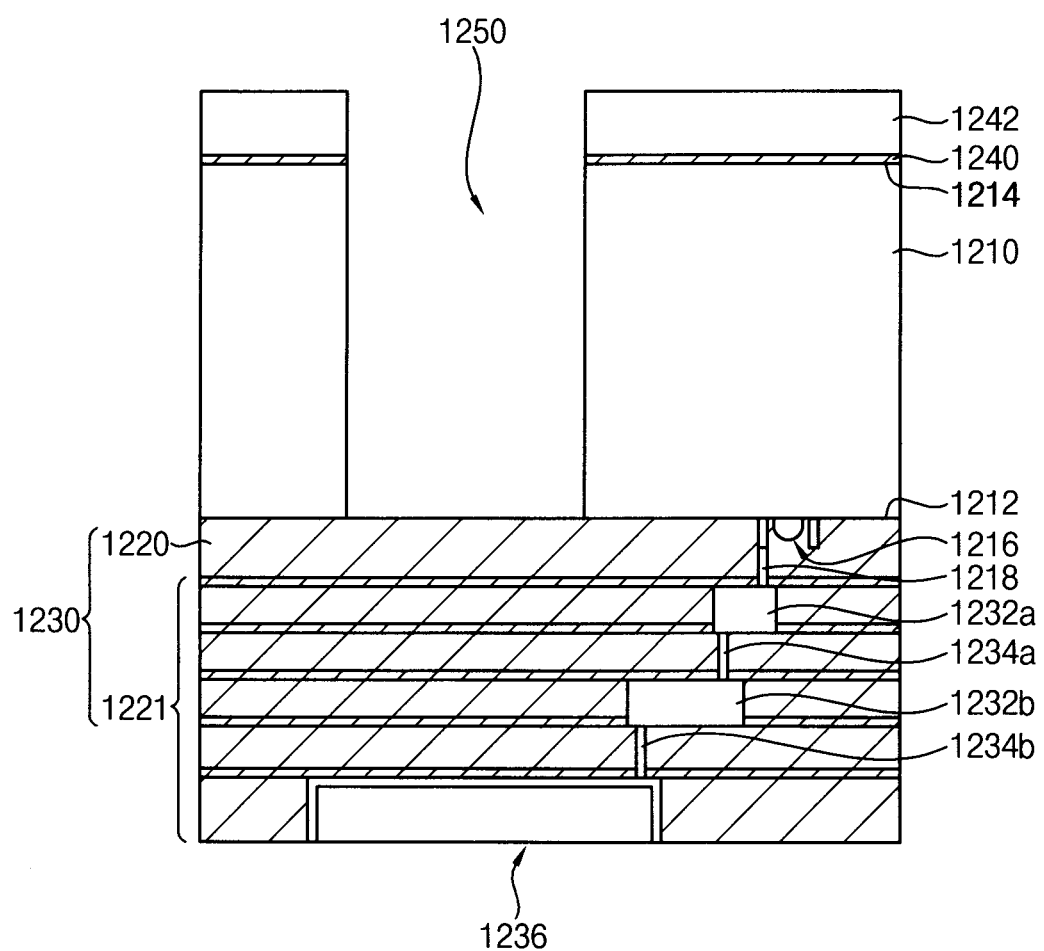

Referring to FIGS. 24 and 25, a first etch process may be performed on the substrate 1210 of the third wafer W3 to form a first opening 1250.

The polishing stop layer 1240 and the substrate 1210 may be partially etched using the first photoresist pattern 1242 to expose the insulation interlayer 1230. That is, the first etch process may be performed until the insulation interlayer 1230 is exposed. Accordingly, the first opening 1250 may extend from the second surface 1214 to the first surface 1212 of the substrate 1210.

Figure 26:
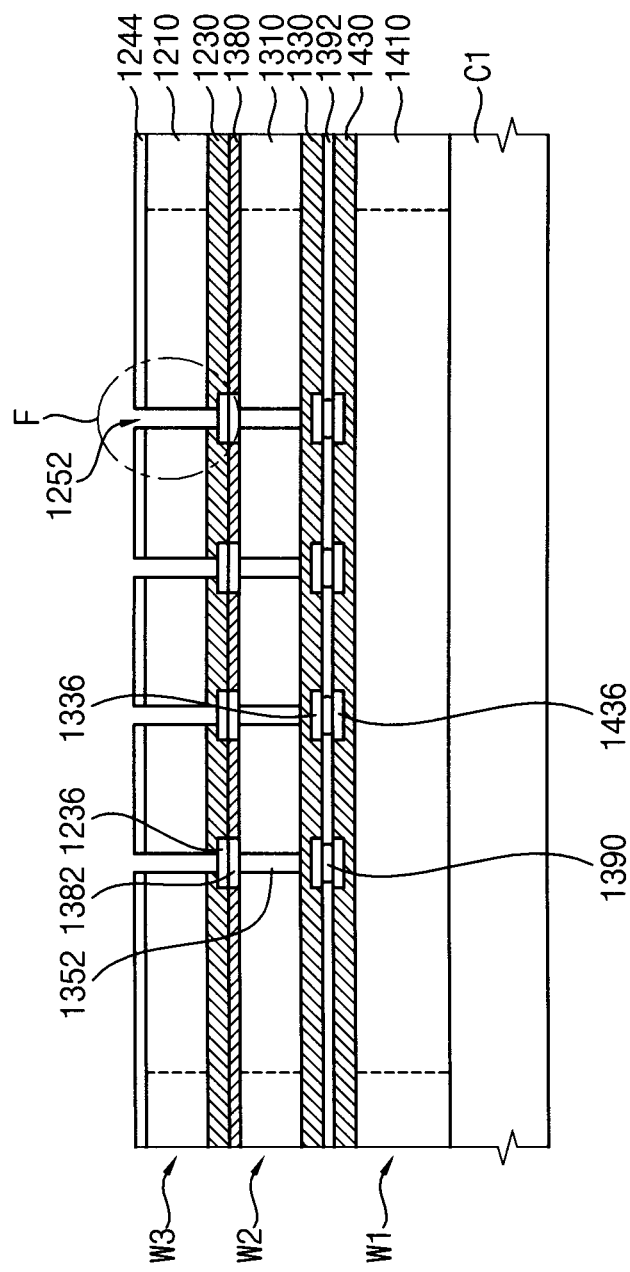
Figure 27:
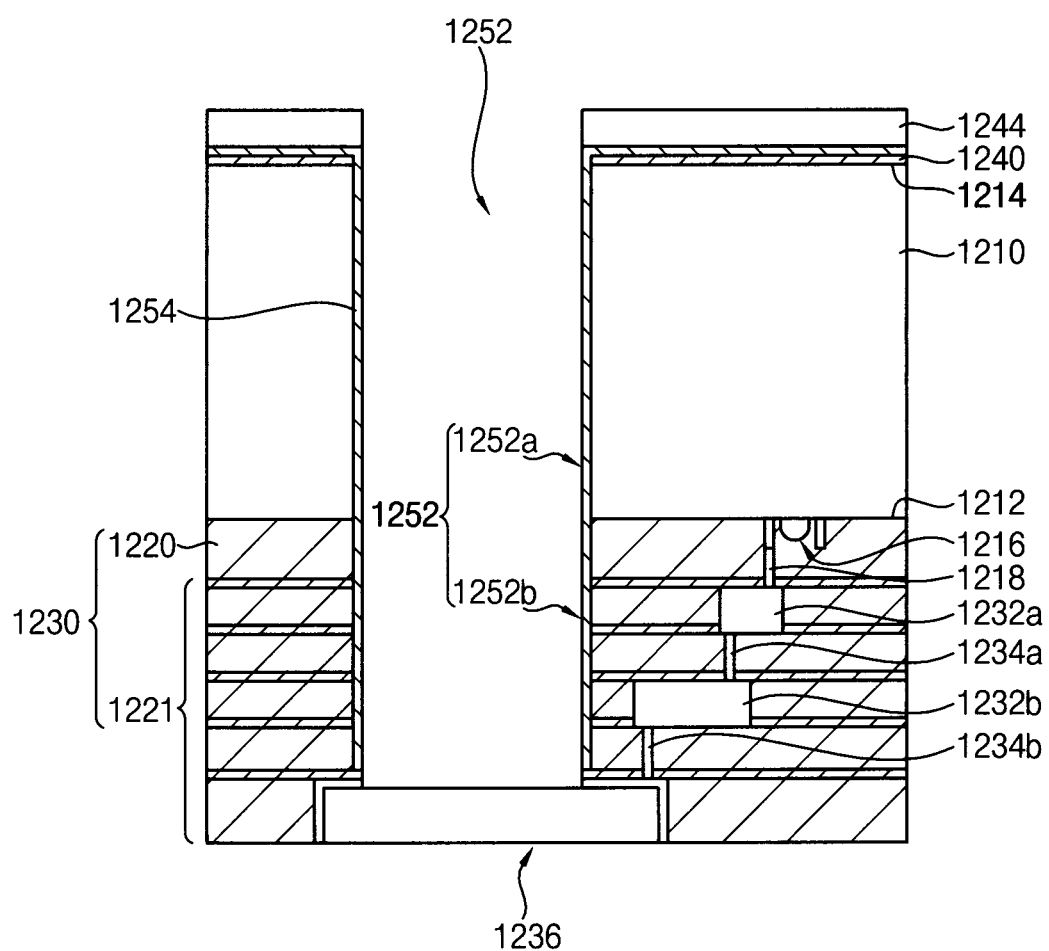

Referring to FIGS. 26 and 27, the insulation interlayer 1230 may be partially etched to a via hole 1252 which exposes the first bonding pad 1236.

In example embodiments, firstly, a second etch process may be performed on the insulation interlayer 1230 to form a second opening which penetrates through a plurality of buffer layers and insulation layers except an outermost insulation layer in which the first bonding pad 136 is provided. Then, the first photoresist pattern 1242 may be removed from the substrate 1310, and then, a liner layer 1254 may be formed along a profile of sidewalls and a bottom face of the second opening and an upper surface of the polishing stop layer 1240. The liner layer 1254 may be formed of silicon oxide or carbon doped silicon oxide.

Then, the liner layer 1254 and remaining insulation layers of a second insulation interlayer 1221 may be etched using a second photoresist pattern 1244 as an etching mask to form the via hole 1252. That is, the etch process may be performed until the first bonding pad 1236 in the outermost insulation layer is exposed. After performing the etch process, the second photoresist pattern 1244 may be removed from the substrate 1210. Alternatively, the etch process may be performed without the second photoresist pattern 1244.

Figure 28:
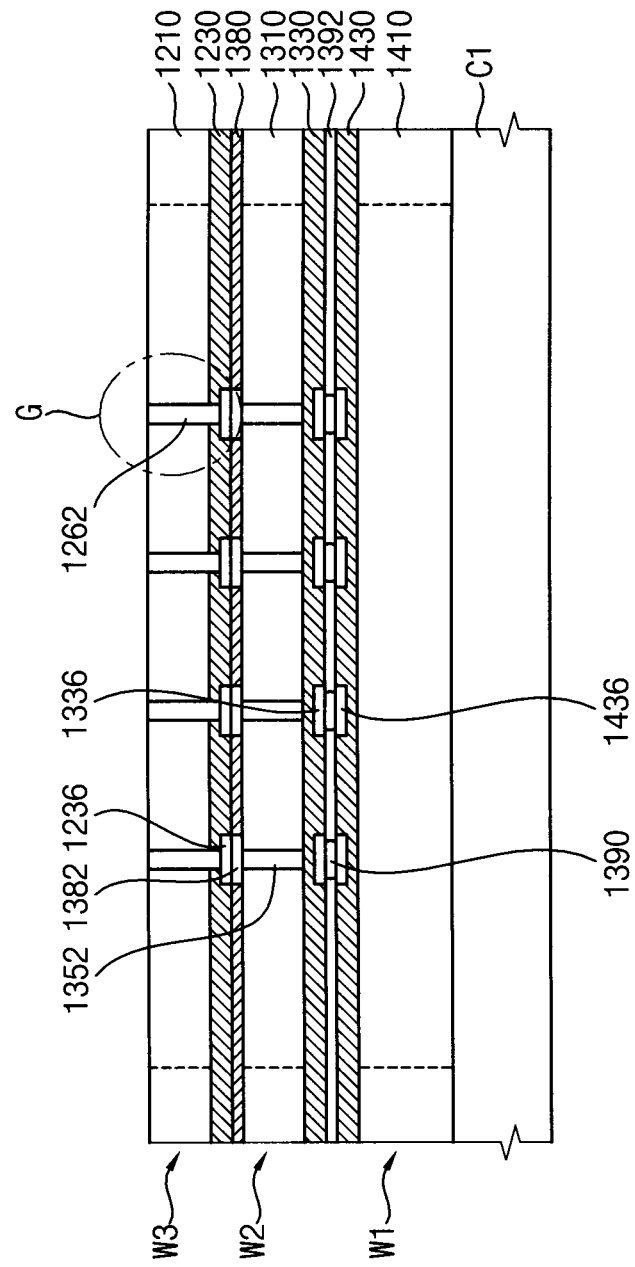
Figure 29:
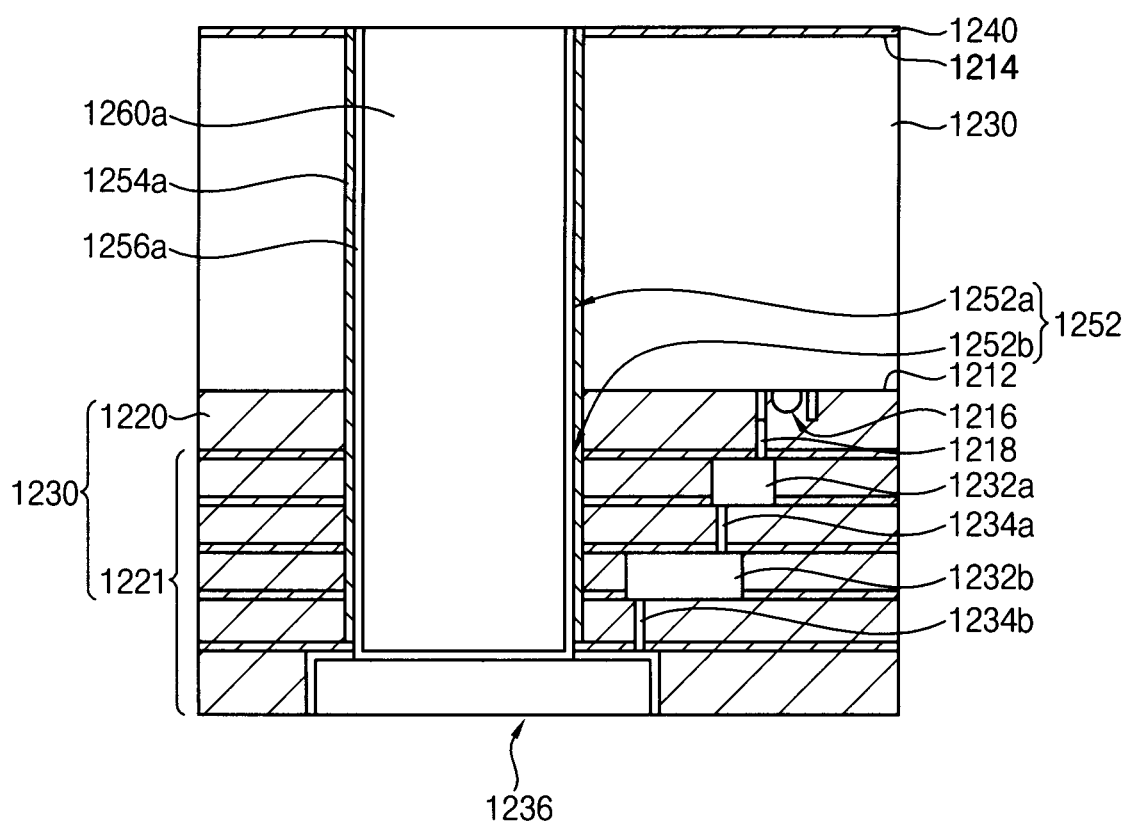

Referring to FIGS. 28 and 29, a TSV, that is, a plug structure 1262 may be formed in the via hole 1252 to make contact with the first bonding pad 1236.

In example embodiments, firstly, a barrier metal layer may be formed on the liner layer 1254. The barrier metal layer may be formed to include a metal nitride, e.g., titanium nitride, tantalum nitride, etc. and/or a metal, e.g., titanium, tantalum, etc.

Then, a seed layer (not illustrated) may be formed on the barrier metal layer, and then, a conductive layer may be formed on the seed layer to fill the via hole 1252. The conductive layer may be formed using a metal material having a low resistance. For example, the conductive layer may be formed using copper by an electro plating process, an electroless plating process, an electrografting process, a physical vapor deposition process, etc.

Then, a chemical mechanical polish process may be performed on the conductive layer, the barrier metal layer and the liner layer 1254 to form the TSV, that is, the plug structure 1262. The plug structure 1260 may include a barrier pattern 1256a and a conductive pattern 1260a. Here, a portion of the polishing stop layer 1240 may remain. The barrier pattern 1256a of the plug structure 1262 may make contact with a pad conductive pattern 1236b of the first bonding pad 1236.

Accordingly, the TSV may contact directly with the first bonding pad 1236 in the outermost insulation layer.

Figure 30:
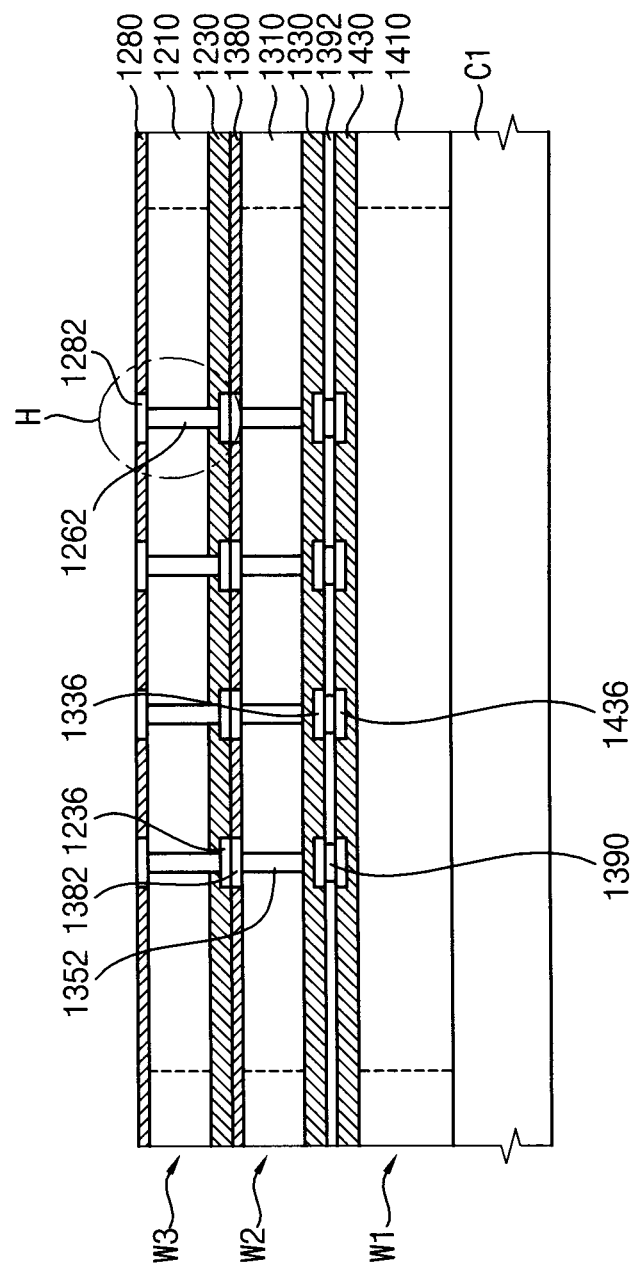
Figure 31:
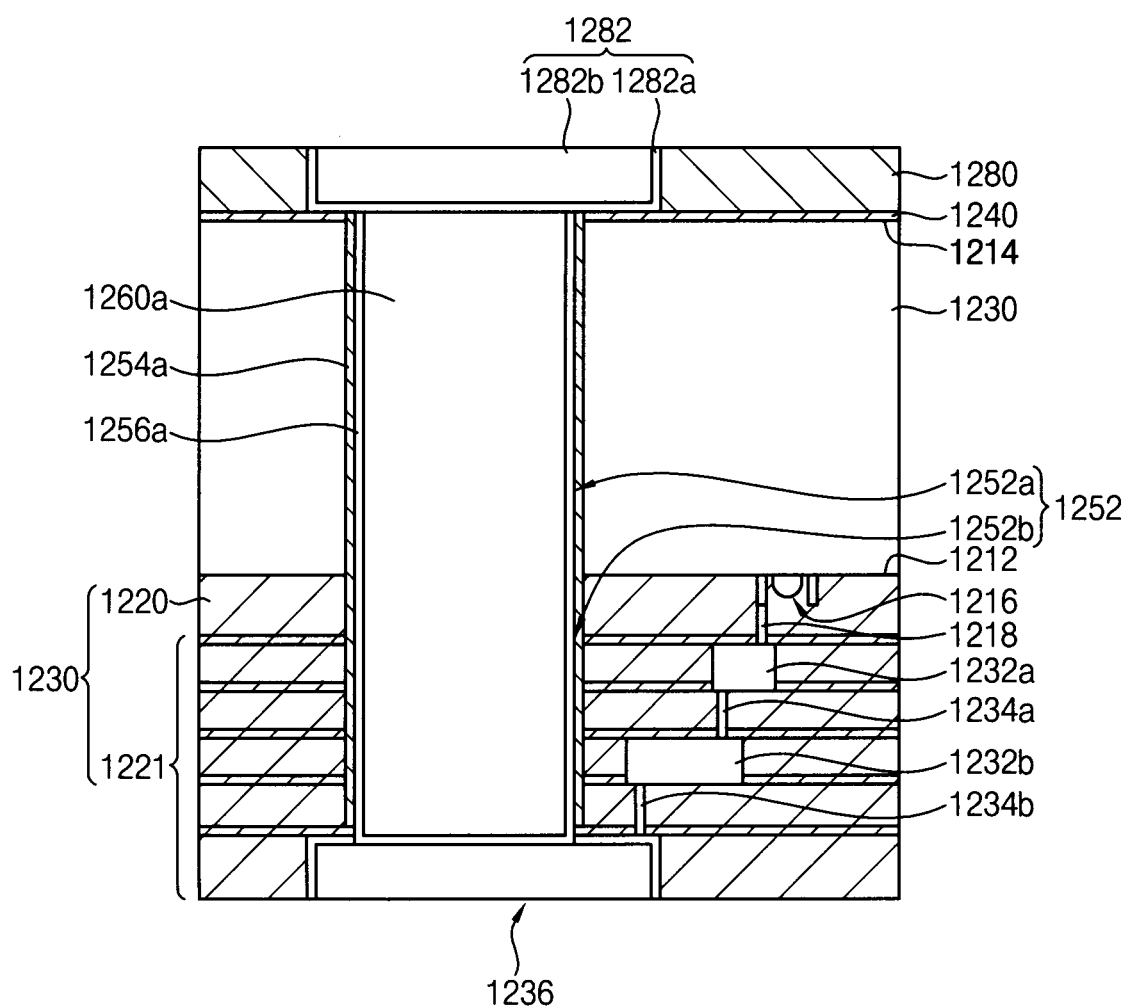

Referring to FIGS. 30 and 31, an insulation layer 1280 having a second bonding pad 1282 may be formed on the second surface 1214 of the substrate 1210. The second bonding pad 1282 may be formed on an upper surface of the plug structure 1262.

The insulation layer 1280 may be formed on the second surface 1214 of the substrate 1210, and then, the insulation layer 1280 may be partially etched to form a fourth trench which exposes the upper surface of the plug structure 1262, and the second bonding pad 1282 may be formed in the fourth trench. A pad barrier pattern 1282a and a pad conductive pattern 1282b may be formed in the fourth trench. The pad conductive pattern 1282b may be formed on the pad barrier pattern 1282a to fill the fourth trench.

Figure 32:
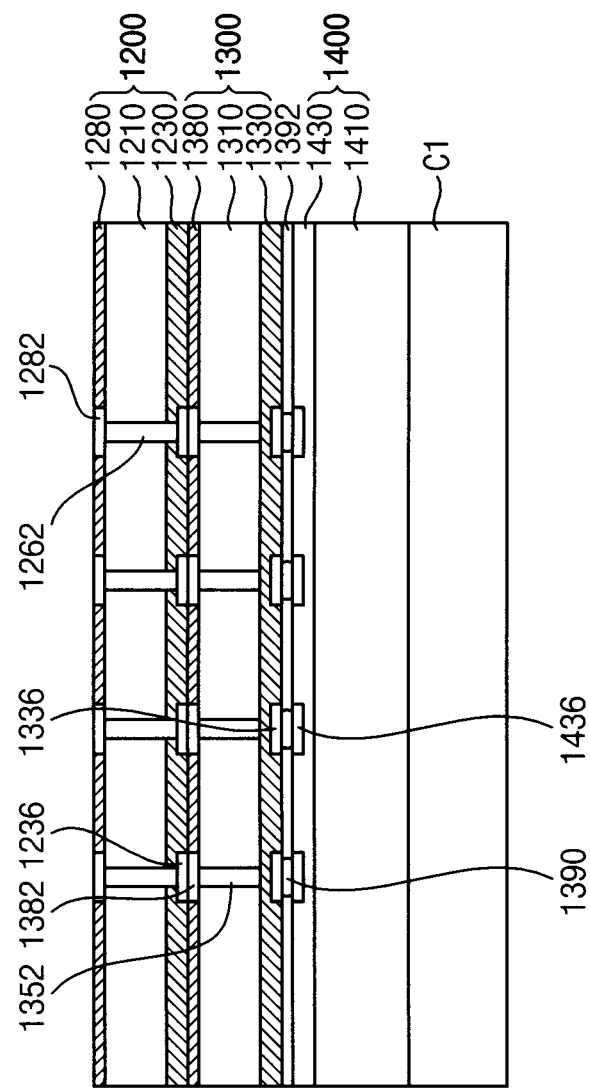
Figure 33:
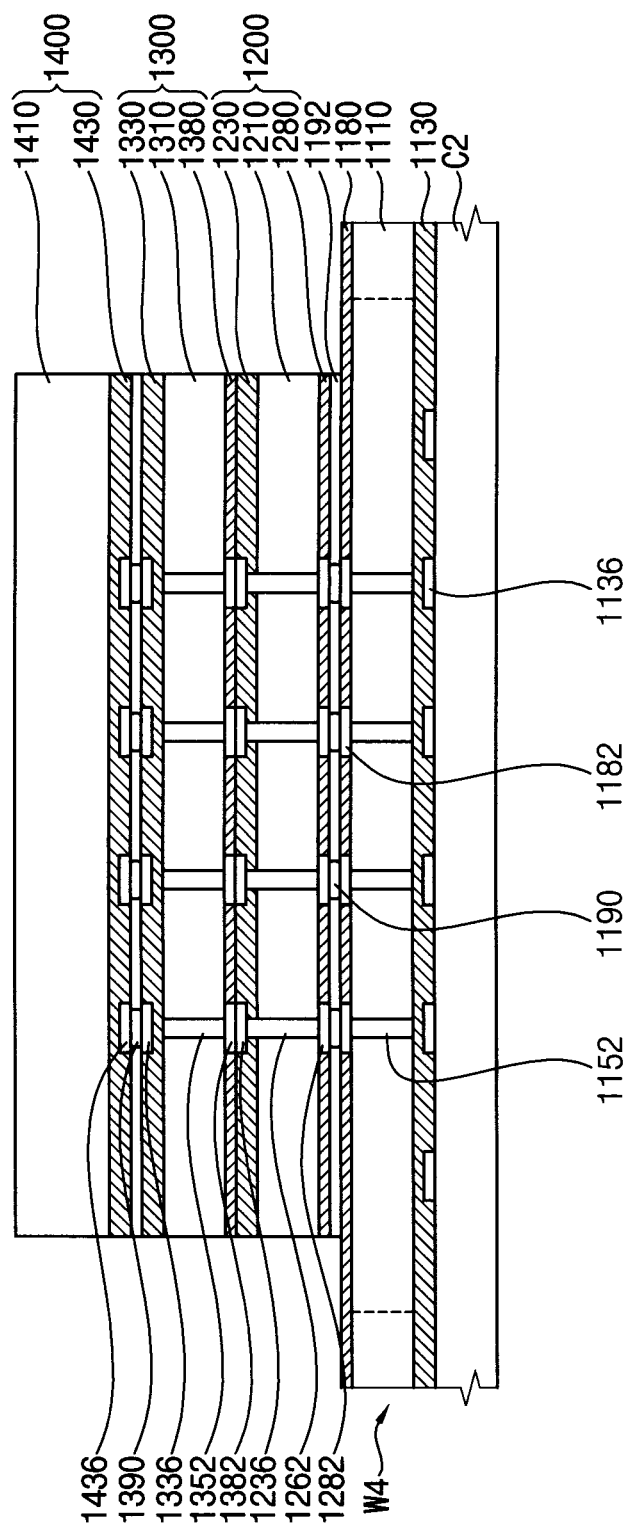

Referring to FIGS. 32 and 33, the stacked first to third wafers W1, W2, W3 may be sawed to form stacked first to third memory dies 1200, 1300, 1400, and then, the stacked first to third memory dies 1200, 1300, 1400 may be stacked on a fourth wafer W4.

In example embodiments, the fourth wafer W4 may be arranged on a second carrier substrate C2, and then, the stacked first to third memory dies 1200, 1300, 1400 may be stacked on the fourth wafer W4.

The fourth wafer W4 may include a substrate 1110, an insulation interlayer 1130, a first bonding pad 1136, a second bonding pad 1182 and a plug structure 1152. The insulation interlayer 1130 may be provided on a first surface of the substrate 1110. The first bonding pad 1136 may be provided in an outermost insulation layer of the insulation interlayer 1130. The second bonding pad 1182 may be formed on a second surface opposite to the first surface of the substrate 1110.

The stacked first to third memory dies 1200, 1300, 1400 may be stacked on the fourth wafer W4 such that the second surface of the first memory die 1200 faces the second surface of the substrate 1110 of the fourth wafer W4. The first memory die 1200 may be adhered on the first wafer W1 using an adhesive film 1192 such as non-conducive film. Conductive bumps 1190 may be interposed between the fourth wafer W4 and the first memory die 1200. The second bonding pad 1182 of the fourth wafer W4 may be electrically connected to the second bonding pad 1282 of the first memory die 1200 through the conductive bump 1190.

Figure 34:
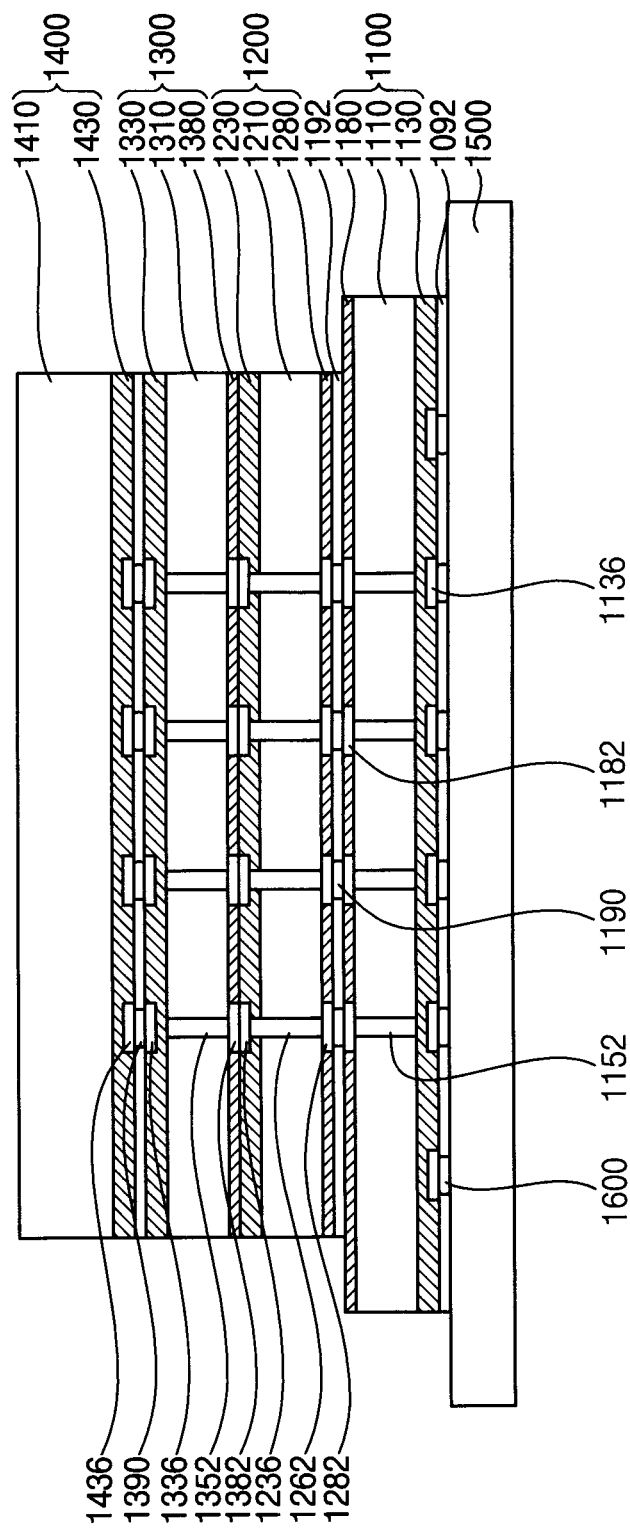

Referring to FIG. 34, the fourth wafer W4 may be sawed to form a stack structure (buffer die 1100 and first to third memory dies 1200, 1300, 1400), and the stack structure may be mounted on the package substrate 1500.

The stack structure may be stacked on the package substrate 1500 via conductive bumps 1600 interposed between the package substrate 1500 and the buffer die 1100. The conductive bump 1600 may be interposed between a substrate pad of the package substrate 1500 and the first bonding pad 1136 of the buffer die 1100 to electrically connect them each other.

Then, a molding member may be formed on an upper surface of the package substrate 1500 to cover the buffer die 1100 and the first to third memory dies 1200, 1300, 1400, and then, outer connection members may be disposed on outer connection pads on a lower surface of the package substrate 1500 to complete a semiconductor package in FIG. 17.

The semiconductor device and the semiconductor package may be applied to various types of semiconductor devices and systems. The semiconductor device may include finFET, DRAM, VNAND, etc. For example, the semiconductor package may be applied to logic devices such as central processing units (CPUs), main processing units (MPUs), or application processors (APs), or the like. Additionally, the semiconductor package may be applied to volatile memory devices such as DRAM devices, SRAM devices, HDM devices, non-volatile memory devices such as flash memory devices, PRAM devices, MRAM devices, ReRAM devices, or CMOS image sensors, or the like.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims.

What is claimed is:
1. A semiconductor package comprising:
 a first semiconductor chip comprising:
  a first substrate comprising a first via hole;
  a first insulation interlayer disposed on a first surface the first substrate, and comprising:
   a first bonding pad interposed between a plurality of surfaces of the first insulation interlayer; and
   a second via hole connected to the first via hole and exposing the first bonding pad;
  a first plug structures disposed within the first via hole and the second via hole, and in contact with the first bonding pad; and
  an insulation layer disposed on a second surface of the first substrate, and comprising a second bonding pad interposed between a plurality of surfaces of the insulation layer, the second bonding pad being in contact with the first plug structure; and a second semiconductor chip stacked on the first semiconductor chip, and comprising a third bonding pad bonded to the second bonding pad that is exposed from one of the plurality of surfaces of the insulation layer of the first semiconductor chip, wherein the third bonding pad is in contact with the second bending pad, and each of the second bonding pad and the third bonding pad comprises a same metal material.

2. The semiconductor package of claim 1, wherein the first insulation interlayer comprises a plurality of stacked insulation layers, and
wherein a metal wiring is disposed in at least one insulation layer of the plurality of stacked insulation layers, and is in contact with the first bonding pad.

3. The semiconductor package of claim 2, wherein the metal wiring is not in contact with the first plug structure.

4. The semiconductor package of claim 2, wherein a thickness of the first bonding pad is greater than a thickness of the metal wiring.

5. The semiconductor package of claim 2, wherein the first bonding pad is disposed in an outermost insulation layer of the first insulation interlayer.

6. The semiconductor package of claim 2, wherein the first insulation interlayer further comprises a buffer layer interposed between a pair of the plurality of stacked insulation layers of the first insulation interlayer.

7. The semiconductor package of claim 1, wherein the first plug structure comprises:
a barrier pattern disposed on inner surfaces of the first via hole and the second via hole; and
a conductive pattern disposed on the barrier pattern to fill the first via hole and the second via hole.

8. The semiconductor package of claim 7, wherein the barrier pattern is interposed between the conductive pattern of the first plug structure and the first bonding pad.

9. The semiconductor package of claim 7, wherein the first plug structure further comprises a liner layer interposed between the barrier pattern of the first plug structure and the first substrate.

10. The semiconductor package of claim 1, wherein each of the first plug structure and the third bonding pad comprises the same metal material.

11. The semiconductor package of claim 1, wherein the second semiconductor chip comprises:
a second substrate comprising a third via hole;
a second insulation interlayer disposed on the second substrate, and comprising:
the third bonding pad interposed between a plurality of surfaces of the second insulation interlayer; and
a fourth via hole connected to the third via hole and exposing the third bonding pad; and
a second plug structure disposed within the third via hole and the fourth via hole, and in contact with the third bonding pad.

12. The semiconductor package of claim 11, wherein, in each of the first insulation interlayer of the first semiconductor chip and the second insulation interlayer of the second semiconductor chip, a circuit pattern and a metal wiring are disposed and are electrically connected to each other,
wherein the metal wiring of the first semiconductor chip is in contact with the first bonding pad, and the metal wiring of the second semiconductor chip is in contact with the second bonding pad, and wherein the first plug structure of the first semiconductor chip is not in contact with the metal wiring of the first semiconductor chip, and the second plug structure of the second semiconductor chip is not in contact with the metal wiring of the second semiconductor chip.

13. The semiconductor package of claim 1, wherein the first bonding pad comprises:
a pad conductive pattern; and
a pad barrier pattern interposed between the pad conductive pattern and the first plug structure.

14. The semiconductor package of claim 1, wherein the second bonding pad comprises:
a pad conductive pattern; and
a pad barrier pattern interposed between the pad conductive pattern and the first plug structure, and
wherein the second bonding pad is in direct physical contact with the third bonding pad of the second semiconductor chip.

15. A semiconductor package, comprising:
a first semiconductor chip comprising:
a first substrate;
a first insulation interlayer disposed on the first substrate, and comprising a first bonding pad interposed between a plurality of surfaces of the first insulation interlayer; and
a first plug structure penetrating through the first substrate and the first insulation interlayer to extend to the first bonding pad; and
a second semiconductor chip stacked on the first semiconductor chip, and comprising a second bonding pad bonded to the first bonding pad that is exposed from one of the plurality of surfaces of the first insulation interlayer of the first semiconductor chip, wherein the second bonding pad is in contact with the first bonding pad, and each of the first bonding pad and the second bonding pad comprises a same metal material.

16. The semiconductor package of claim 15, wherein the first substrate comprises a first via hole,
wherein the first insulation interlayer further comprises a second via hole connected to the first via hole and exposing the first bonding pad, and
wherein the first plug structure is disposed within the first via hole and the second via hoe.

17. The semiconductor package of claim 15, wherein the first insulation interlayer comprises a plurality of stacked insulation layers,
wherein a metal wiring is disposed in at least one insulation layer of the plurality of stacked insulation layers, and is in contact with the first bonding pad, and
wherein the metal wiring is not in contact with the first plug structure.

18. The semiconductor package of claim 17, wherein a thickness of the first bonding pad is greater than a thickness of the metal wiring.

19. The semiconductor package of claim 15, wherein the first bonding pad is disposed in an outermost insulation layer of the first insulation interlayer, and
wherein the outermost insulation layer comprises a redistribution wiring layer.

20. The semiconductor package of claim 15, wherein the first plug structure is in contact with the first bonding pad.

* * * * *